US010375853B2

(12) United States Patent
Aiello et al.

(10) Patent No.: US 10,375,853 B2
(45) Date of Patent: Aug. 6, 2019

(54) ELECTRONIC DEVICE WITH COOLING FAN

(71) Applicant: Apple Inc., Cupertino, CA (US)

(72) Inventors: Anthony J. Aiello, Santa Cruz, CA (US); Jonathan L. Berk, Mountain View, CA (US); Karen Cheng, Mountain View, CA (US); Jesse T. Dybenko, Santa Cruz, CA (US); Trevor Edmonds, San Francisco, CA (US); Kwonil D. Fleischman, San Jose, CA (US); Richard A. Herms, Los Altos, CA (US); Eric A. Knopf, Mountain View, CA (US); Arash Naghib Lahouti, San Jose, CA (US); Brad L. Patton, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/682,291

(22) Filed: Aug. 21, 2017

(65) Prior Publication Data

US 2018/0070472 A1    Mar. 8, 2018

Related U.S. Application Data

(60) Provisional application No. 62/384,041, filed on Sep. 6, 2016, provisional application No. 62/413,395, filed on Oct. 26, 2016.

(51) Int. Cl.
*H05K 7/20* (2006.01)
*G06F 1/20* (2006.01)
(Continued)

(52) U.S. Cl.
CPC ......... *H05K 7/20145* (2013.01); *F04D 17/16* (2013.01); *F04D 25/0613* (2013.01);
(Continued)

(58) Field of Classification Search
CPC ........ G06F 1/1658; G06F 1/1662; G06F 1/20; G06F 1/203; H01L 23/4006; H01L 23/467
(Continued)

(56) References Cited

U.S. PATENT DOCUMENTS 6,241,007 B1 * 6/2001 Kitahara .................. G06F 1/203
165/185
6,407,921 B1 * 6/2002 Nakamura ............... G06F 1/203
165/104.33
(Continued)

FOREIGN PATENT DOCUMENTS

WO    2014/103371 A1    7/2014

OTHER PUBLICATIONS

Notice of Allowance received for Singapore Patent Application No. 10201609616T, dated Mar. 15, 2018, 6 pages.
(Continued)

*Primary Examiner* — Dion Ferguson
*Assistant Examiner* — Amir A Jalali
(74) *Attorney, Agent, or Firm* — Dentons US LLP

(57) ABSTRACT

In an exemplary electronic device with a cooling fan, a fan assembly is attached to a keyboard assembly of the electronic device. The fan assembly includes an impeller at least partially inside a fan enclosure. The fan enclosure has, on a surface, an inlet opening and an external protrusion. The electronic device further includes a bottom case. The fan assembly is positioned between the keyboard assembly and the bottom case and oriented such that the inlet opening and the external protrusion face the bottom case. The external protrusion maintains a passage between the fan enclosure and the bottom case that allows air to enter the inlet opening and also resists interference between the rotating impeller and the stationary bottom case.

28 Claims, 13 Drawing Sheets

(51) Int. Cl.
*G06F 1/16* (2006.01)
*H01L 23/467* (2006.01)
*H01L 23/40* (2006.01)
*F04D 17/16* (2006.01)
*F04D 25/06* (2006.01)
*F04D 29/44* (2006.01)

(52) U.S. Cl.
CPC ......... *F04D 29/441* (2013.01); *G06F 1/1658* (2013.01); *G06F 1/1662* (2013.01); *G06F 1/20* (2013.01); *G06F 1/203* (2013.01); *H01L 23/4006* (2013.01); *H01L 23/467* (2013.01)

(58) Field of Classification Search
USPC ............. 361/679.46–679.54, 688–723; 165/80.1–80.3
See application file for complete search history.

(56) References Cited

U.S. PATENT DOCUMENTS

| | | | | |
|---|---|---|---|---|
| 6,442,025 | B2* | 8/2002 | Nakamura | G06F 1/203 165/104.33 |
| 6,496,369 | B2* | 12/2002 | Nakamura | G06F 1/1616 165/80.3 |
| 7,934,540 | B2* | 5/2011 | Joshi | H01L 23/473 165/104.33 |
| 9,861,005 | B2* | 1/2018 | Li | G06F 1/203 |
| 2002/0080579 | A1 | 6/2002 | Shibasaki et al. | |
| 2002/0172008 | A1 | 11/2002 | Michael | |
| 2003/0024693 | A1 | 2/2003 | Petty et al. | |
| 2006/0078428 | A1* | 4/2006 | Zheng | F04D 17/04 415/206 |
| 2006/0079169 | A1 | 4/2006 | Kuo | |
| 2006/0133048 | A1* | 6/2006 | Kobayashi | F04D 29/601 361/720 |
| 2007/0041157 | A1* | 2/2007 | Wang | G06F 1/203 361/679.54 |
| 2008/0062645 | A1* | 3/2008 | Iijima | G06F 1/203 361/695 |
| 2008/0138134 | A1* | 6/2008 | Wilde | G06F 1/1613 400/472 |
| 2008/0174957 | A1* | 7/2008 | Lev | G06F 1/203 361/694 |
| 2008/0266782 | A1 | 10/2008 | Zhang et al. | |
| 2009/0175003 | A1* | 7/2009 | Ali | G06F 1/203 361/695 |
| 2009/0310296 | A1 | 12/2009 | Peng et al. | |
| 2009/0314465 | A1 | 12/2009 | Zheng et al. | |
| 2009/0316425 | A1 | 12/2009 | Inoue et al. | |
| 2010/0073853 | A1 | 3/2010 | Suzuki et al. | |
| 2010/0142146 | A1* | 6/2010 | Hwang | F04D 17/16 361/695 |
| 2010/0294463 | A1 | 11/2010 | Nie et al. | |
| 2011/0149504 | A1* | 6/2011 | Wikander | G06F 1/203 361/679.47 |
| 2011/0157824 | A1 | 6/2011 | Fujiwara et al. | |
| 2012/0000625 | A1 | 1/2012 | Tan | |
| 2012/0113585 | A1 | 5/2012 | Stanley et al. | |
| 2012/0160462 | A1 | 6/2012 | Guan | |
| 2012/0186961 | A1* | 7/2012 | Oike | G06F 1/1662 200/5 A |
| 2012/0294109 | A1* | 11/2012 | Boozer | A47J 43/0716 366/206 |
| 2012/0308417 | A1 | 12/2012 | Hsu et al. | |
| 2013/0027881 | A1* | 1/2013 | Goto | G06F 1/203 361/697 |
| 2013/0057776 | A1 | 3/2013 | Yamaguchi et al. | |
| 2013/0192802 | A1* | 8/2013 | Chou | G06F 1/203 165/122 |
| 2013/0250515 | A1* | 9/2013 | Wu | H05K 7/20145 361/692 |
| 2013/0279112 | A1* | 10/2013 | Kim | H05K 7/20154 361/692 |
| 2013/0327507 | A1 | 12/2013 | Degner et al. | |
| 2014/0086762 | A1* | 3/2014 | Horng | F04D 25/0613 417/354 |
| 2014/0118939 | A1* | 5/2014 | Lin | F04D 25/0613 361/695 |
| 2014/0154067 | A1 | 6/2014 | Shih et al. | |
| 2014/0185223 | A1* | 7/2014 | Matsumoto | G06F 1/203 361/679.27 |
| 2014/0314558 | A1* | 10/2014 | Tsai | F04D 25/0613 415/206 |
| 2015/0016987 | A1 | 1/2015 | Yamamoto | |
| 2015/0023784 | A1 | 1/2015 | Koizumi | |
| 2015/0152883 | A1* | 6/2015 | Dybenko | F04D 25/0613 415/220 |
| 2015/0275901 | A1* | 10/2015 | Yang | G06F 1/20 361/679.08 |
| 2015/0342091 | A1 | 11/2015 | Scharinger et al. | |
| 2015/0377238 | A1* | 12/2015 | Fujimoto | F04D 29/281 417/423.7 |
| 2016/0013696 | A1* | 1/2016 | Aiello | F04D 25/0613 310/71 |
| 2017/0067470 | A1* | 3/2017 | Patton | F04D 17/10 |
| 2018/0023589 | A1* | 1/2018 | Nakaniwa | F04D 29/286 415/203 |
| 2018/0135647 | A1* | 5/2018 | Okada | F04D 17/122 |
| 2018/0283198 | A1* | 10/2018 | Shin | F01D 17/165 |

OTHER PUBLICATIONS

International Search Report and Written Opinion received for PCT Patent Application No. PCT/US2017/048504, dated Nov. 6, 2017, 25 pages.
Invitation to Respond to Written Opinion received for Singapore Patent Application No. 10201609616T, dated Jan. 18, 2018, 5 pages.
Search Report and Written Opinion received for Singaporean Patent Application No. 10201609616T, completed on Mar. 14, 2017, 10 pages.
International Preliminary Report on Patentability received for PCT Patent Application No. PCT/US2017/048504, dated Mar. 21, 2019, 21 pages.

* cited by examiner

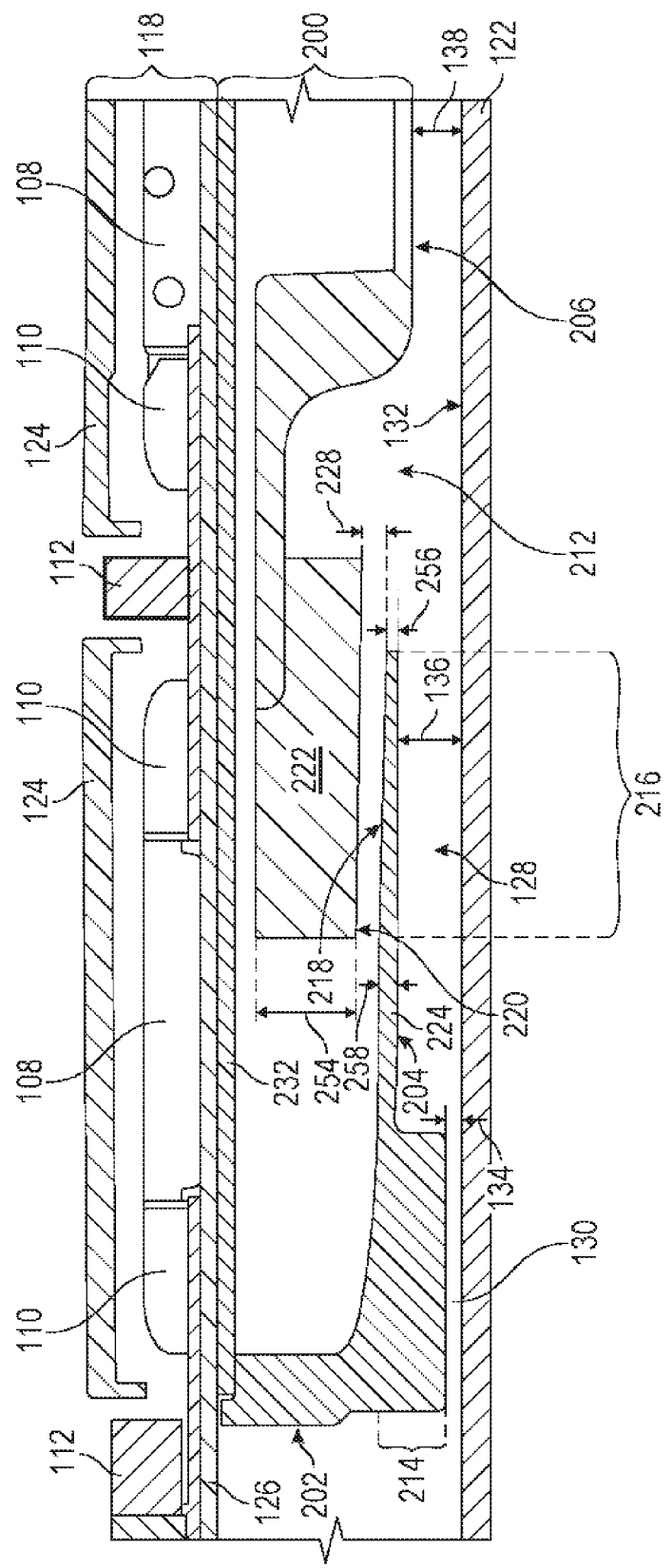

ELECTRONIC DEVICE WITH COOLING FAN

CROSS-REFERENCE TO RELATED APPLICATIONS

This application claims priority from U.S. Provisional Ser. No. 62/384,041, filed on Sep. 6, 2016, entitled ELECTRONIC DEVICE WITH COOLING FAN, and from U.S. Provisional Ser. No. 62/413,395, filed on Oct. 26, 2016, entitled ELECTRONIC DEVICE WITH COOLING FAN, which are hereby incorporated by reference in their entirety for all purposes.

FIELD

This relates generally to electronic devices, and more specifically, to electronic devices with internal cooling fans.

BACKGROUND

As recent models of electronic devices are becoming increasingly faster and more powerful, they are also becoming sleeker and smaller in size. Consumer preferences and demands tend to drive both of these trends toward faster and smaller. Electronic device makers are thus faced with the challenges of incorporating faster and more powerful electronic chips and circuitry into smaller electronic device offerings.

Electronic devices contain components that produce heat during normal operation. Fans, heat sinks, and/or other heat management components are used to reduce heat. But increasingly faster and more powerful chips and integrated circuitry can generate more heat than previous generations of electronics. Placement of these components into smaller overall volumes can create new challenges.

SUMMARY

In an exemplary electronic device with a cooling fan, a fan assembly is attached to a keyboard assembly of the electronic device. The fan assembly includes an impeller at least partially inside a fan enclosure. The fan enclosure has, on a surface, an inlet opening and an external protrusion. The electronic device further includes a bottom case. The fan assembly is positioned between the keyboard assembly and the bottom case and oriented such that the inlet opening and the external protrusion face the bottom case. The external protrusion maintains a passage between the fan enclosure and the bottom case that allows air to enter the inlet opening.

BRIEF DESCRIPTION OF THE DRAWINGS

FIG. 1C illustrates a cross-sectional view of a portion of an electronic device with an internal cooling fan, according to various examples.

DETAILED DESCRIPTION

Figure 1A:
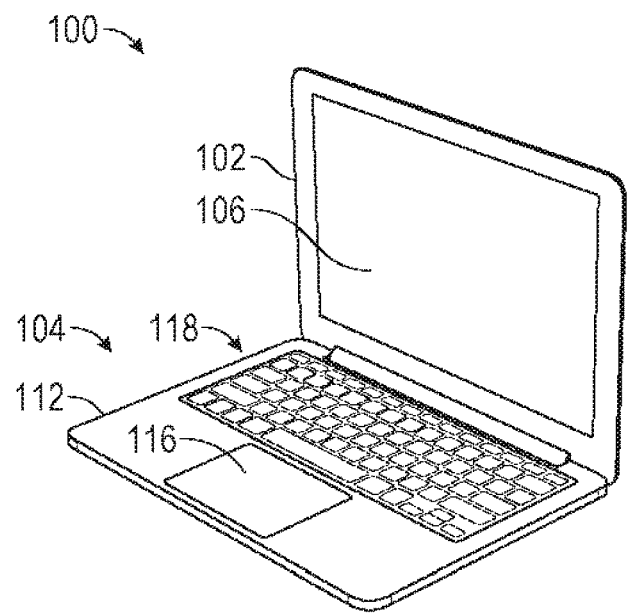
FIG. 1A illustrates a front perspective view of an electronic device, according to various examples.

The following description is presented to enable a person of ordinary skill in the art to make and use the various embodiments. Descriptions of specific devices and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Electronic devices contain components that produce heat during normal operation. As such, fans, heat sinks, and other heat diversion components are used to manage operating temperatures in some electronic devices. Heat-producing components generate heat at increasing levels, and ongoing consumer demands require that devices become smaller and thinner, such that fans and other components need to be smaller and more efficient. However, integrating fans into smaller or thinner devices can result in the fans being more susceptible to damage during user handling events. In particular, fans that are integrated into smaller or thinner devices can have components that are positioned very close together. This increases the likelihood that stationary and moving components in the fan rub against each other and cause damage or unwanted noise during user handling events. For example, force exerted on the keyboard or external case of an electronic device can transfer to the fan and cause stationary components of the fan (e.g., the fan enclosure) to rub against moving components of the fan (e.g., the impeller). Furthermore, fans that are integrated into smaller or thinner devices can be more susceptible to localized obstruction to airflow, which can result in higher friction losses, more turbulent airflow, vortex shedding, and increased aeroacoustic noise. There is thus a desire for improved fan designs that occupy less space, have sufficient structural support and margin to resist user handling events, and/or produce reduced aeroacoustic noise while still delivering acceptable levels of device heat management.

In accordance with at least some of the embodiments set forth herein, various structures and arrangements for cooling fans of electronic devices are described that address the challenges discussed above. In one exemplary electronic device, a fan assembly is attached to a keyboard assembly of the electronic device. The fan assembly includes an impeller at least partially inside a fan enclosure. The fan enclosure has, on a surface, an inlet opening and an external protrusion. The electronic device further includes a bottom case. The fan assembly is positioned between the keyboard assembly and the bottom case and oriented such that the inlet opening and the external protrusion face the bottom case. The external protrusion maintains clearance between the fan assembly and the bottom case during user handling events to ensure proper fan operation.

FIG. 1A illustrates a front perspective view of an exemplary electronic device. In various embodiments, an electronic device suitable for use with the disclosed cooling fan can include a desktop computing device with a built-in display, a portable computing device, or a video-streaming device, for example. In the example shown in FIG. 1A, electronic device 100 can be a consumer electronic device such as a laptop computer. As shown, electronic device 100 includes display housing 102 coupled with base portion 104, allowing display housing 102 to pivot with respect to base portion 104. In some examples, display housing 102 and base portion 104 are formed from a metal, such as aluminum. In other examples, display housing 102 and base portion 104 are formed from plastic. Display housing 102 includes display panel 106 designed to provide visual content. Base portion 104 includes top case 112 coupled with a bottom case (e.g., bottom case 122 shown in FIG. 1C). Top case 112 and the bottom case define a space designed to receive several components of electronic device 100, such as processor circuits, memory circuits, and one or more battery modules. Also, base portion 104 includes several components allowing a user to input one or more controls to the electronic device 100, such as touch pad 116 and keyboard assembly 118.

Figure 1B:
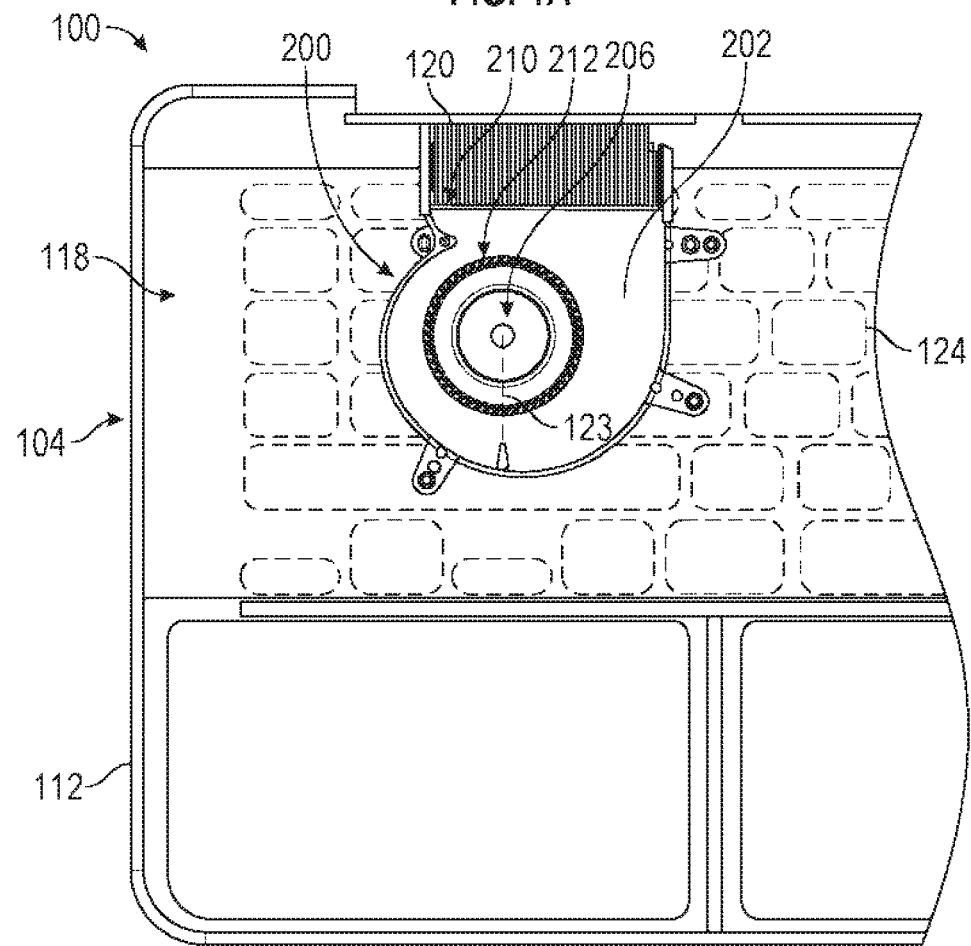
FIG. 1B illustrates a partial plan view of an interior region of a base portion of an electronic device with a cooling fan, according to various examples.

During use of electronic device 100, some of the several components enclosed within the space defined by the top and bottom cases convert electrical energy into heat, thereby causing an increase in the temperature of electronic device 100. To reduce the temperature, base portion 104 can include an internal cooling fan. For example, FIG. 1B illustrates a partial plan view of an interior region of base portion 104 of electronic device 100, according to various examples. The bottom case of base portion 104 is removed to show cooling fan 200 disposed within base portion 104. In the perspective view shown in FIG. 1B, keys 124 of keyboard assembly 118 are oriented into the plane of the drawing and cooling fan 200 is positioned over the bottom surface of keyboard assembly 118. Cooling fan 200 includes fan enclosure 202 and impeller 206 disposed at least partially inside fan enclosure 202. Fan enclosure 202 forms an exterior surface for the fan and defines inlet opening 212 and outlet opening 210 of cooling fan 200. Heat from at least some of the several components of electronic device 100 can be transported via a heat pipe (not shown) to cooling fins 120 that are disposed adjacent to outlet opening 210. A motor (not shown) of cooling fan 200 is configured to rotate impeller 206 to draw air into inlet opening 212 and expel air through outlet opening 210 into cooling fins 120, thereby removing heat from cooling fins 120 and cooling electronic device 100.

FIG. 1C illustrates a cross-sectional view of a portion of electronic device 100 with cooling fan 200, according to various examples. Specifically, FIG. 1C is a cross-sectional view of electronic device 100 taken along the portion indicated by dotted line 123 on FIG. 1B. Bottom case 122 of base portion 104 is included in the depiction of electronic device 100 in FIG. 1C. As shown, keyboard assembly 118 and cooling fan 200 are disposed at least partially between top case 112 and bottom case 122 of bottom portion 104. Keyboard assembly 118, in some examples, is attached to top case 112. Cooling fan 200 is attached to base layer 126 of keyboard assembly 118 and is oriented such that inlet opening 212 and external protrusion 214 face bottom case 122. Cooling fan 200, in some examples, does not directly contact bottom case 122. As shown in FIG. 1C, external protrusion 214 protrudes from outer surface 204 of fan enclosure 202. External protrusion 214 is separated from bottom case 122 by gap 130 and thus does not directly contact bottom case 122. In some examples, height 134 of gap 130 is approximately 0.8-1.2 mm. In a specific example, height 134 of gap 130 is approximately 1.0 mm.

External protrusion 214 can serve to increase the amount of force that cooling fan 200 can sustain from user handling of electronic device 100 before damage is incurred. For example, during user handling of electronic device 100, top case 112 and/or bottom case 122 can experience compressive forces that cause bottom case 122 to translate toward cooling fan 200 or vice versa. During such events, external protrusion 214 resists inner surface 132 of bottom case 122 from directly contacting impeller 206. Direct contact of bottom case 122 with impeller 206 is undesirable as it can interfere with the rotation of impeller 206, which can generate undesirable frictional noise and also cause damage to cooling fan 200.

External protrusion 214 maintains passage 128 between fan enclosure 202 and bottom case 122 that allows air to enter the inlet opening 212. Specifically, during most user handling events where compressive forces are applied to top case 112 and/or bottom case 122, inner surface 132 of bottom case 122 can directly contact external protrusion 214 without inner surface 132 of bottom case 122 directly contacting impeller 206 or portion 216 of fan enclosure 202. External protrusion 214 thus increases the amount of force that top case 112 and/or bottom case 122 can sustain before bottom case 122 interferes with the rotation of impeller 206. This can enable base portion 104 to have a thinner design because less clearance between bottom case 122 and fan enclosure or between blades 222 and portion 216 of fan enclosure 202 would need to be provided. Additionally, external protrusion 214 enables cooling fan 200 to be positioned closer to bottom case 122 because external protrusion 214 serves to limit the motion of cooling fan 200 during a shock event (e.g., electronic device is dropped and impacts a surface). This is desirable because reducing the motion of cooling fan 200 reduces the amount of strain that cooling fan 200 experiences. In some examples, height 136 of passage 128 between portion 216 and bottom case 122 is approximately 1.8-2.0 mm. In some examples, distance 138 between the hub of impeller 206 and bottom case 122 is approximately 1.5-1.8 mm. Additional details regarding external protrusion 214 are described below with reference to FIGS. 2A-D and FIGS. 3-5.

As depicted in FIG. 1C, cooling fan 200 is positioned between keyboard assembly 118 and bottom case 122. Cooling fan 200 is attached to base layer 126 of keyboard assembly 118 and keyboard assembly 118 is attached to top case 112, in some examples. In addition to base layer 126, keyboard assembly 118 includes keys 124, support mechanisms 110, and electronics package 108. Each key 124 is supported by support mechanism 110 that translates key 124 vertically in response to a downward force on key 124 during a keystroke event. In some examples, each electronics package 108 includes a switch attached to a flexible printed circuit board. The switch of electronics package 108 biases key 124 to be in its natural, non-depressed position. When key 124 is placed in a depressed position by a keystroke event, the switch can cause the keystroke event to be registered by circuitry associated with the switch or by other circuitry contained within electronics package 108. In some examples, each electronics package 108 further includes a light source (e.g., light-emitting diode) for backlighting the respective key 124. Support mechanisms 110 and electronics packages 108 are attached to base layer 126 of keyboard assembly 118. Base layer 126 can provide the platform for the components contained within the keyboard assembly. In some examples, base layer 126 includes openings (e.g., openings 1206 shown in FIGS. 12A-B) that extend from a top surface to a bottom surface of base layer 126. The openings enable air under key 124 to vent through base layer 126 into an internal region of base portion 104 when key 124 is depressed. Base layer 126 includes one or more layers. For example, base layer 126 includes one or more of a feature plate, a circuit board, an illumination panel, or a sensor membrane. One skilled in the art would recognize that base layer 126 can include other layers necessary for the function of keyboard assembly 118. In some examples, base layer 126 includes an electromagnetic inference (EMI) shielding layer for shielding the electronic components of keyboard assembly 118 (e.g., electronics packages 108 or the circuit board of base layer 126) from EMI generated by components within bottom portion 104. The EMI shielding layer also shields EMI generated by components within bottom portion 104, thereby reducing the amount of EMI escaping into free-space. The EMI shielding layer, in some examples, is the bottommost layer of base layer 126 adjacent to cooling fan 200. In some examples, the EMI shielding layer includes a metal film that extends across base layer 126. The EMI shielding layer can be grounded. In a specific example, the EMI shielding layer includes an aluminized Mylar layer.

In the present example, cooling fan 200 is directly attached to keyboard assembly 118. Specifically, cooling fan 200 is directly attached to the bottom surface of keyboard assembly 118 such that a majority of an outer surface of back wall 232 is positioned substantially flush against the bottom surface of keyboard assembly 118. The majority of the outer surface of back wall 232 is thus in direct contact with the bottom surface of keyboard assembly 118. In the present example, the bottom surface of keyboard assembly 118 corresponds to the bottom surface of base layer 126. Specifically, the bottom surface of base layer 126 is oriented toward bottom case 122 and away from keys 124. Back wall 232 of fan enclosure 202 is disposed on a side of the fan enclosure 202 opposite of inlet opening 212. Back wall 232 is thus oriented toward top case 112. Positioning back wall 232 of fan enclosure 202 directly against the bottom surface of keyboard assembly 118 can be desirable to reduce the vertical space occupied by the fan, which enables a thinner base portion 104 of electronic device 100. Additionally, the amount of noise generated during operation of cooling fan 200 is reduced. Specifically, when back wall 232 is positioned directly against base layer 126 of keyboard assembly 118, the vibration of back wall 232 caused by the rotation of the motor and impeller 206 is dampened by base layer 126 and other components of keyboard assembly 118. This reduces the amplitude of vibration generated by cooling fan 200. In contrast, if cooling fan 200 were attached to keyboard assembly 118 with spacers that maintain a gap (e.g., greater than 0.2 mm gap) between the outer surface of back wall 232 and the bottom surface of keyboard assembly 118, back wall 232 is less supported and various vibration modes can develop on back wall 232 during operation of cooling fan 200. This could result in increased vibrational noise from cooling fan 200. Additional aspects regarding positioning back wall 232 of cooling fan 200 against the bottom surface of keyboard assembly 118 are described below with reference to FIGS. 12A-B.

Figure 2A:
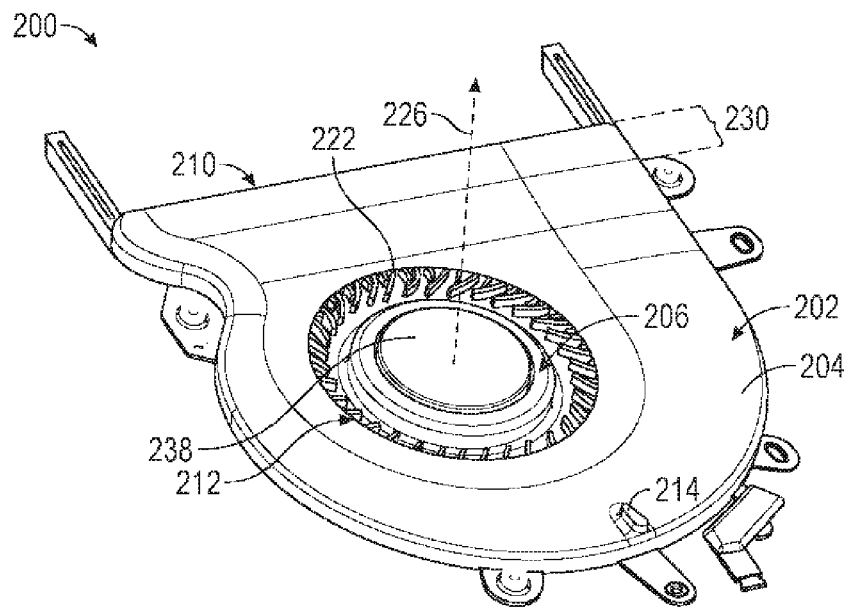
FIGS. 2A-2B illustrate top perspective views of a cooling fan of an electronic device, according to various examples.
Figure 2B:
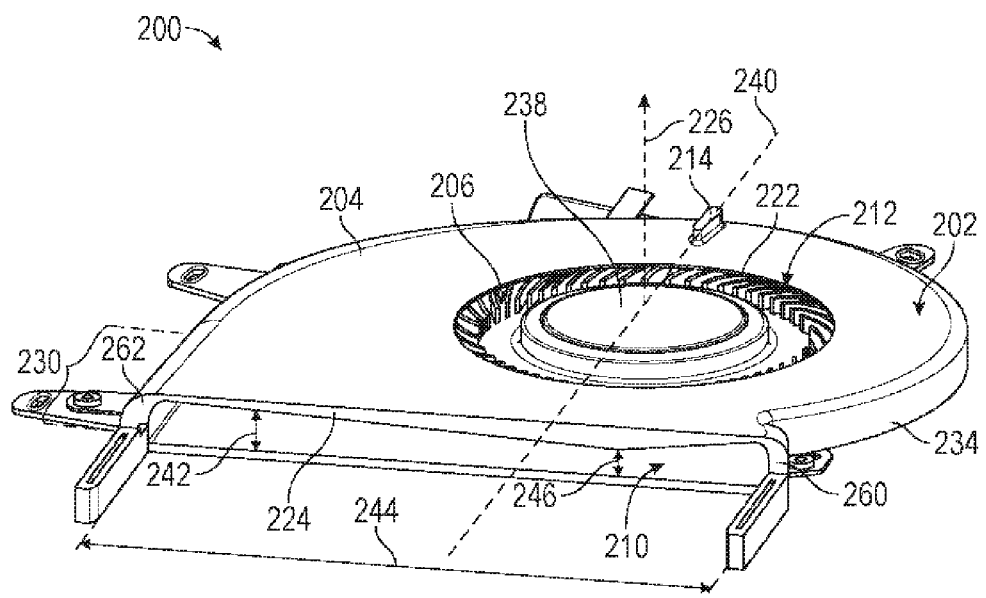
Figure 2C:
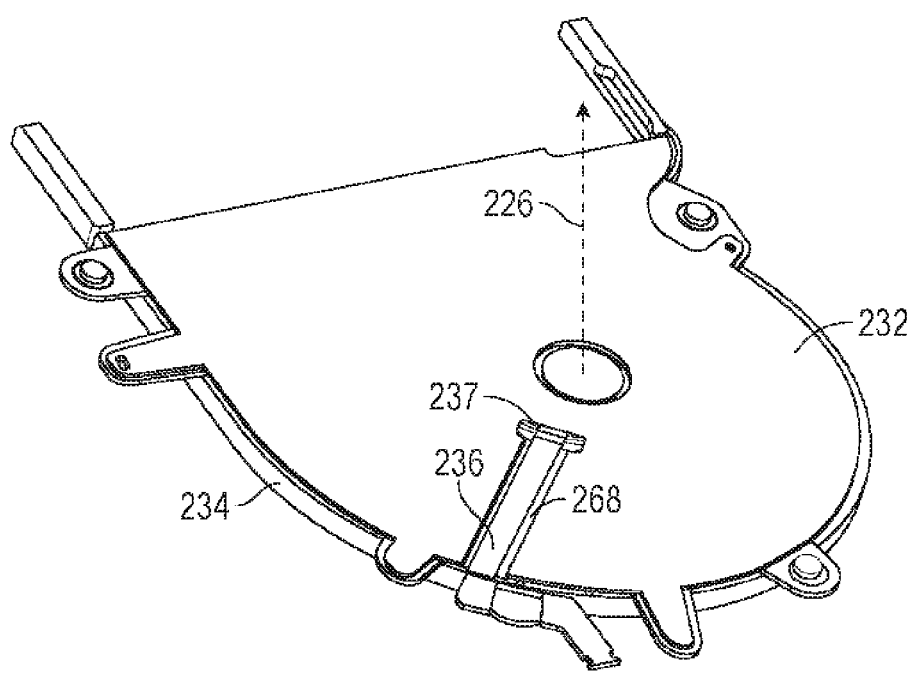
FIG. 2C illustrates a bottom perspective view of a cooling fan of an electronic device, according to various examples.
Figure 2D:
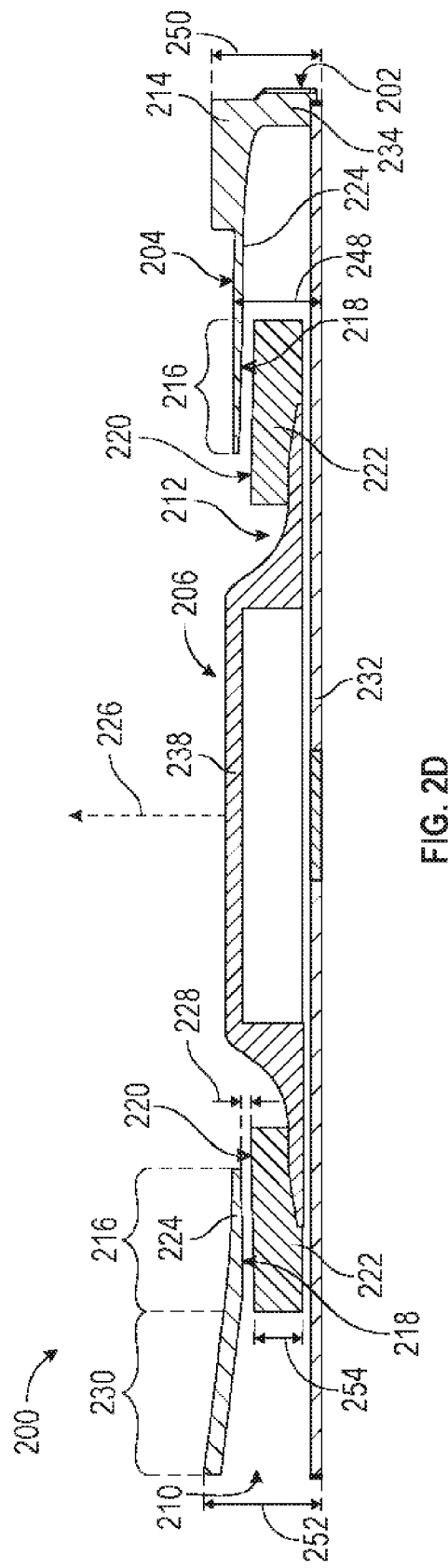
FIG. 2D illustrates a cross-sectional view of a cooling fan of an electronic device, according to various examples.

Various aspects of cooling fan 200 are now described in detail with reference to FIGS. 2A-D. FIGS. 2A-B illustrate top perspective views of cooling fan 200, according to various examples. FIG. 2C illustrates a bottom perspective view of cooling fan 200, according to various examples. FIG. 2D illustrates a cross-section view of cooling fan 200 with the motor and bearing not shown, according to various examples. The cross-sectional view of cooling fan 200 in FIG. 2D is taken along dotted line 240 shown in FIG. 2B. Cooling fan 200 can also be referred to as a fan assembly.

In the present example, cooling fan 200 is a centrifugal fan designed to draw air through inlet opening 212 into the center of the fan and drive the air radially outward from the center of the fan and out through outlet opening 210 of the fan. Cooling fan 200 includes fan enclosure 202 that forms an exterior surface for the fan and impeller 206 that is disposed at least partially inside fan enclosure 202. Fan enclosure 202 also defines a fan cavity that at least partially houses impeller 206. Impeller 206 includes a plurality of blades 222 positioned around hub 238. A portion of impeller 206 extends out from the interior of fan enclosure 202 through inlet opening 212. Specifically, as shown in FIGS. 2A-D, hub 238 of impeller 206 extends at least partially out through inlet opening 212. It should be recognized that in other examples, the impeller can be entirely disposed within the fan enclosure such that the hub of the impeller does not extend beyond the plane of inlet opening 212. Although in the present example, cooling fan 200 is a centrifugal fan, it should be recognized that at least some of the features of cooling fan 200 described herein are applicable to other mechanical fan configurations.

Cooling fan 200 further includes a motor and bearing (not shown) disposed within fan hub 238 that rotates impeller 206 with respect to rotation axis 226 that is aligned to the center of hub 238. Power is transmitted to the motor via flexible printed circuit (FPC) 236 of cooling fan 200 (shown in FIG. 2C). As the motor turns, the motor emits a back electromotive force (EMF) signal that is transmitted through FPC 236 to a driver circuit separate from cooling fan 200. FPC 236 is thus configured to transmit a back EMF signal generated by the motor of cooling fan 200 to the driver circuit. The back EMF signal indicates the rotational speed of the motor. One end of FPC 236 is attached to the motor within fan enclosure 202. FPC 236 extends out from fan enclosure 202 through opening 237 (e.g., similar or identical to opening 802 shown in FIG. 8) on back wall 232. An external portion of FPC 236 is positioned along the outer surface of back wall 232 of fan enclosure 202.

Fan enclosure 202 includes front wall 224 disposed on one side of impeller 206 and back wall 232 disposed on an opposite side of impeller 206. Fan housing 202 also includes sidewalls 234 that surround most of the perimeter of impeller 206. Sidewalls 234 couple back wall 232 to front wall 224. In the present example, front wall 224 and side wall 234 are formed integrally as one part. Front wall 224 defines inlet opening 212 for allowing air to enter into fan enclosure 202 of cooling fan 200. In some examples, a second inlet opening for allowing air into the fan enclosure can be included on the back wall of the fan enclosure. Fan enclosure 202 further includes diffuser portion 230 disposed on one side of cooling fan 200. During operation of cooling fan 200, air is directed through a diffuser channel (e.g., diffuser channel 606 shown in FIG. 6) of diffuser portion 230 and expelled out from outlet opening 210. Outlet opening 210 is disposed at the end of the diffuser channel and is oriented approximately perpendicularly to inlet opening 212. It should be recognized that various alternative air inlet and air outlet arrangements may also be used.

The dimensions of fan enclosure 202 are suitably designed to address the challenges discussed above. In one aspect, the vertical profile of fan enclosure is small to enable a thinner and sleeker electronic device. For instance, in some examples, distance 248 from outer surface 204 of front wall 224 adjacent to blade 222 to outer surface of back wall 232 is approximately 4.0-4.4 mm, distance 252 from outer surface 204 of front wall 224 at outlet opening 210 to outer surface of back wall 232 at outlet opening is approximately 5.0-6.0 mm, and distance 250 from end surface of external protrusion 214 to outer surface of back wall 232 is approximately 5.0-6.0 mm.

As briefly discussed above, fan enclosure 202 includes external protrusion 214 that protrudes from outer surface 204 of fan enclosure 202. In some examples, external protrusion 214 is approximately perpendicular to outer surface 204 of fan enclosure 202. External protrusion 214 is configured to resist bottom case 122 from directly contacting impeller 206 or outer surface 204 of fan enclosure 202, thereby increasing the amount of force that cooling fan 200 can sustain during user handling events before damage or unwanted rubbing noise is incurred. In particular, during most user handling events, passage 128 is maintained between outer surface 204 of fan enclosure 202 and bottom case 122 and allows air to enter inlet opening 212. At the same time, because external protrusion 214 protrudes from outer surface 204, external protrusion can partially obstruct airflow toward inlet opening 212. Excessive obstruction to the airflow can cause the formation of turbulent airflow upstream of inlet opening 212. The turbulent airflow can be intensified by impeller 206 after entering inlet opening and can cause airflow exiting outlet opening 210 to become even more turbulent. Turbulent airflow entering or exiting cooling fan 200 is undesirable as it produces undesirable aeroacoustic noise. In order to reduce the formation of turbulent airflow through passage 128, external protrusion 214 can be positioned away from areas where airflow is the strongest. For example, external protrusion 214 can be positioned on outer surface 204 where airflow toward inlet opening 212 is minimal. In the present example, airflow toward inlet opening 212 is the strongest near diffuser portion 230 and near inlet opening 212. Thus, as shown in FIGS. 2A-B, external protrusion 214 is positioned proximate to a side opposite of diffuser portion 230 such that inlet opening 212 is positioned between external protrusion 214 and diffuser portion 230. Additionally, external protrusion 214 is positioned proximate to sidewall 234 and thus away from inlet opening 212 where airflow is stronger. Specifically, external protrusion 214 is positioned closer to sidewall 234 of fan enclosure 202 than inlet opening 212.

In the present example, as shown in FIG. 2D, at least a portion of external protrusion 214 directly overlaps with a portion of sidewall 234. Positioning external protrusion 214 at the perimeter of outer surface 204 and above sidewall 234 can be desirable for providing greater support and strength to external protrusion 214. A force applied to external protrusion 214 by bottom case 122 would thus be distributed through sidewall 234 rather than cause front wall 224 to translate toward blades 222. This is advantageous for providing further resistance against front wall 224 contacting blades 222.

Figure 3:
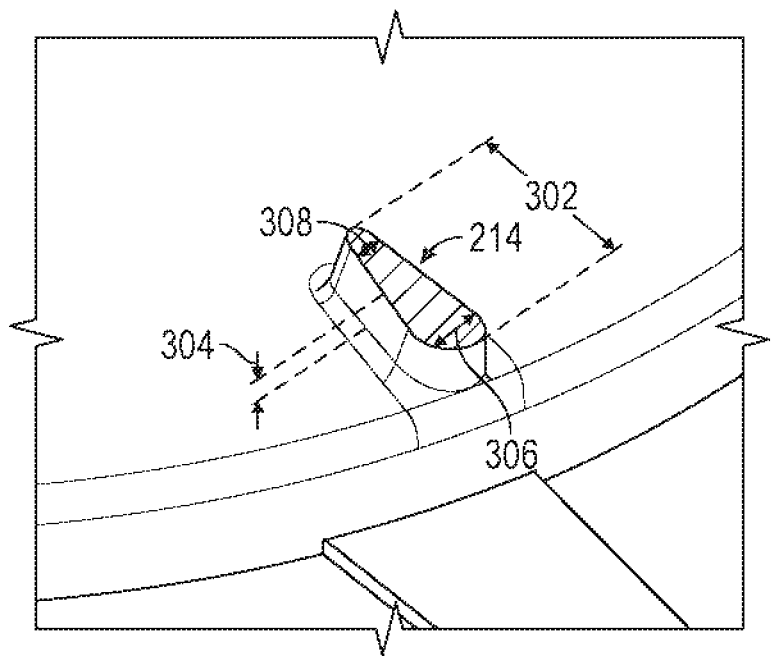
FIG. 3 illustrates a magnified perspective view of an external protrusion on the surface of a cooling fan, according to various examples.

In some examples, the external protrusion is aerodynamically-shaped to further reduce the formation of undesirable air flow structures such as vortices or turbulent wakes around the external protrusion. FIG. 3 illustrates a magnified perspective view of external protrusion 214 on outer surface 204 of cooling fan 200, according to various examples. As shown, the cross-section of external protrusion 214 has a teardrop shape to reduce the disturbance to the surrounding air flow field caused by external protrusion 214. In the present example, the teardrop-shaped cross-section is symmetric, with its axis of symmetry aligned with the local air flow direction. In other examples, the teardrop shaped cross-section can be asymmetric. The cross-section of external protrusion 214 is tapered toward the inlet opening 212. Specifically, the wider end of the teardrop cross-section is proximate to sidewall 234 and the narrower end of the teardrop cross-section is proximate to inlet opening. Both the wider end and the narrower end of external protrusion 214 are rounded. In some examples, diameter 306 at the wider rounded end of external protrusion 214 is 1.5-3.0 mm and diameter 308 at the narrower rounded end of external protrusion 214 is 0.5-1.5 mm. In some examples, long dimension 302 of external protrusion 214 is aligned radially with respect to the center of impeller 206 or the center of inlet opening 212. In other examples, long dimension 302 of external protrusion 214 is aligned with the local direction of the air flow, which is towards the center of impeller 206 or the center of inlet opening 212. In some examples, long dimension 302 of external protrusion 214 is approximately 5-7 mm, and height 304 of external protrusion 214 is approximately 1-3 mm. It should be recognized that various other similar aerodynamic designs can be implemented for external protrusion 214. For example, external protrusion 214 can generally have an elongated cross-section with a narrow end and a wider end. In other examples, external protrusion 214 has an elliptical cross-section with narrower opposite ends and a wider middle portion.

Figure 4:
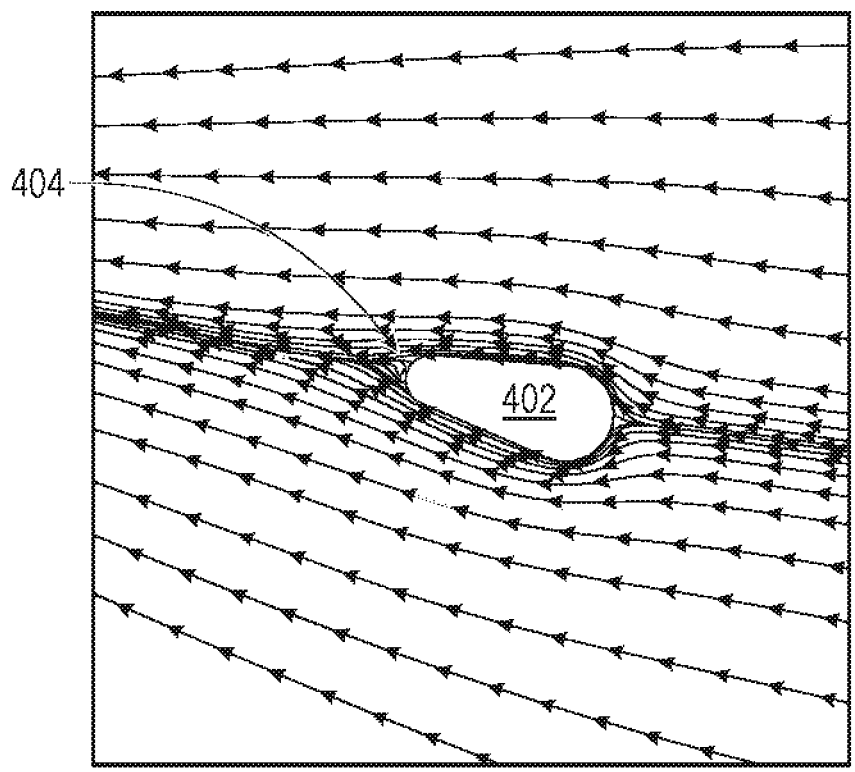
FIG. 4 illustrates simulated airflow around an external protrusion of a cooling fan, where the external protrusion has a teardrop-shaped cross-section, according to various examples.
Figure 5:
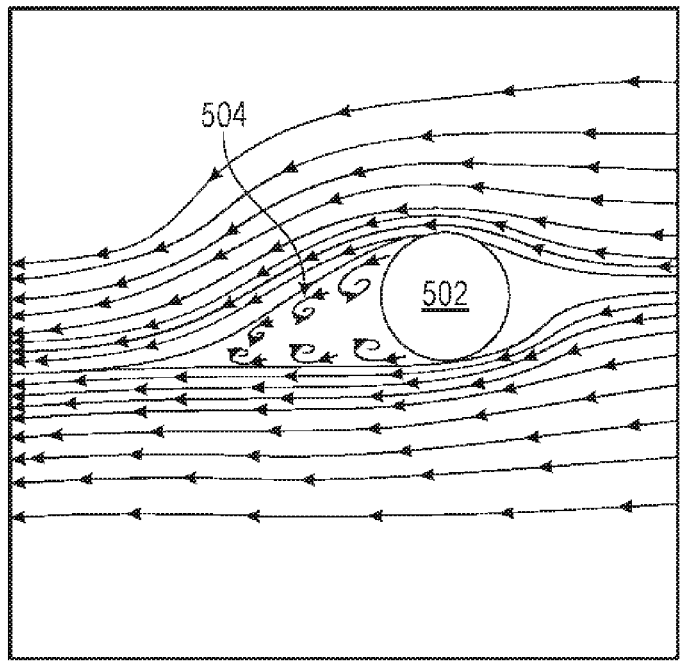
FIG. 5 illustrates simulated airflow around an external protrusion of a cooling fan, where the external protrusion has a circular cross-section, according to various examples.

The aerodynamic shape of external protrusion 214 can be advantageous to reduce the formation undesirable airflow structures or increased turbulence. FIG. 4 illustrates simulated airflow around external protrusion 402 of a cooling fan, where external protrusion 402 has a teardrop-shaped cross-section. As air flows around external protrusion 402, only a relatively small region 404 of separated wake flow is formed downstream of the narrow end of external protrusion 402. In contrast, FIG. 5 illustrates simulated airflow around external protrusion 502 of a cooling fan, where external protrusion 502 has a circular cross-section. As air flows around external protrusion 502, the flow separates extensively from the circular cross-section and causes a significantly larger region of separated wake flow and alternating vorticity (represented by arrows 504) downstream of external protrusion 502. Thus, as illustrated by FIGS. 4 and 5, an aerodynamically shaped (e.g., teardrop-shaped) external protrusion can be advantageous as it reduces the formation of unsteady and turbulent airflow in its wake and thus reduces the amount of aeroacoustic noise generated by the cooling fan.

Although in the present example, cooling fan 200 is depicted as having only one external protrusion 502 on surface 204 of fan enclosure 202, it should be recognized that in some examples, the cooling fan can have more than one external protrusion on the surface of the fan enclosure. In some examples, more than one external protrusion can be desirable to distribute any applied force over a larger surface. This may, for example, reduce the likelihood that any applied force would cause an external protrusion to damage (e.g., cause an indentation or crack in) the bottom case of the electronic device. The additional structural support from multiple external protrusions may also reduce the likelihood that a user handling event would cause the bottom case to directly contact the impeller or front wall 224 of the fan enclosure. In addition, the external protrusion(s) can act together with the raised diffuser portion 230 with height 252 to provide additional support against deflection of bottom case 122. In other examples, having more than one external protrusion may not be desirable from an aerodynamic point of view. The additional external protrusions can cause additional obstruction and produce significant undesirable air flow structures or turbulent airflow that generates excessive aeroacoustic noise. In these examples, the cooling fan 200 has only one external protrusion on an outer surface of the fan enclosure.

With reference back to FIGS. 1C and 2D, front wall 224 of fan enclosure 202 adjacent to blades 222 is discussed in greater detail. Specifically, front wall 224 of fan enclosure 202 adjacent to blades 222 may not have a uniform thickness. In some examples at least a portion 216 of front wall 224 of fan enclosure 202 increases in thickness radially outward from the inlet opening 212. As shown, portion 216 includes the portion of front wall 224 surrounding inlet opening 212 and adjacent to blades 222 of impeller. The thickness variation can be desirable to improve clearance 228 between inner surface 218 of portion 216 of front wall 224 and blades 222. Specifically, during a keystroke event where a force is applied to keyboard assembly 118, the applied force can cause base layer 126 of keyboard assembly 118 to deflect toward cooling fan 200, which can in turn cause back wall 232 of fan enclosure 202 to translate impeller 206 toward portion 216 of front wall 224. The thickness variation of portion 216 of front wall 224 increases clearance 228 between front wall 224 and impeller 206, which increases the amount of force required to cause impeller 206 to contact front wall 224 and reduces the likelihood that impeller 206 contacts front wall 224.

In some examples, each blade 222 of impeller 206 is tapered such that height 254 of each blade decreases toward the perimeter of impeller 206 along the length of the blade. Specifically, each blade 222 includes edge 220 proximate to portion 216 of front wall 224. Edge 220 of each blade 222 is sloped away from a rotation axis 226 of impeller 206 to form a tapered blade. In some examples, edge 220 has a linear slope. The thickness of portion 216 of front wall 224 varies such that inner surface 218 of portion 216 of front wall 224 has a slope that is similar to edge 220 of each blade. For example, inner surface 218 of portion 216 of front wall 224 is approximately parallel to edge 220 of each blade 222, in that the slope of the taper to inner surface 218 matches the slope of the taper to edge 220 of blade 222. In some examples, inner surface 218 of portion 216 has a linear slope in a radial direction with respect to a center of inlet opening 212. In some examples, inner surface 218 of portion 216 is sloped in a radial direction with respect to a center of inlet opening 212 at an angle of approximately 5-9 degrees with respect to the plane of rotation of impeller 206. Additionally, in some examples, edge 220 of each blade 222 is positioned no more than approximately 0.6 mm from inner surface 218 of portion 216 of front wall 224. In some examples, edge 220 of each blade 222 is positioned approximately 0.3-0.6 mm from inner surface 218 of portion 216 of front wall 224. In some examples, the average distance of edge 220 of each blade 222 to inner surface 218 of portion 216 of front wall 224 is approximately 0.4-0.6 mm.

Further, in some examples, the outer surface of portion 216 of front wall 224 has a slope that is different than inner surface 218 of portion 216 of front wall 224. Specifically, the slope of the outer surface of portion 216 of front wall 224 can be configured based on aesthetic considerations or aerodynamic considerations of airflow over the outer surface 204. In some examples, outer surface of portion 216 has a curved slope. The outer surface of portion 216 of front wall 224 can be sloped in a manner that reduces the thickness profile of cooling fan 200. In some examples, the outer surface of portion 216 of front wall 224 is approximately parallel to the rotation plane of impeller 206. In other examples, the outer surface of portion 216 of front wall 224 is sloped toward rotation axis 226. In some examples, thickness 256 of portion 216 at inlet opening 212 is 0.3-0.5 mm and thickness 258 of portion 216 at the perimeter of impeller 206 is 0.4-0.6 mm.

Figure 6:
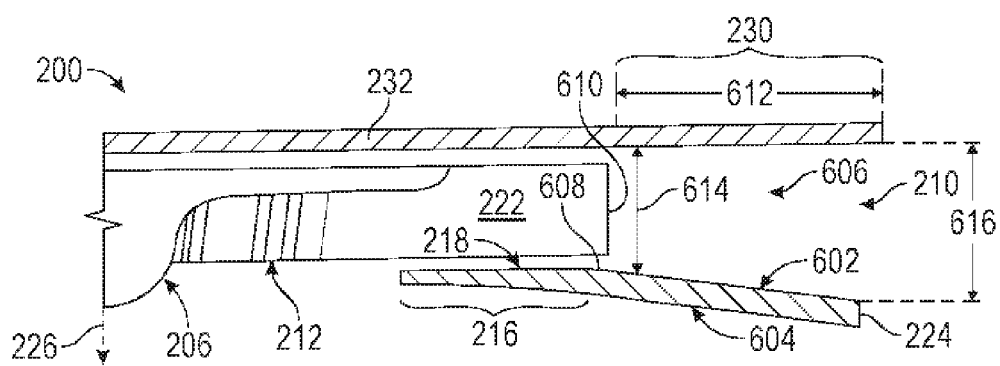
FIG. 6 illustrates a cross-sectional view of a diffuser portion of a cooling fan, according to various examples.

Turning now to FIG. 6, diffuser portion 230 of cooling fan 200 is described in greater detail. FIG. 6 illustrates a cross-section view of diffuser portion 230 of cooling fan 200, according to various examples. As discussed briefly above, diffuser portion 230 channels airflow out through outlet opening 210. Diffuser portion 230 includes the portion of fan enclosure 202 that extends from an outer edge of impeller 206 to outlet opening 210. Diffuser portion 230 includes diffuser channel 606 that is defined by front wall 224, sidewall 234, and back wall 232 of fan enclosure 202. Outlet opening 210 is disposed at an end of diffuser channel 606. Diffuser portion 230 and outlet opening 210 are suitably designed to reduce the use of space (e.g., in the horizontal direction with fan 200 lying on back wall 232). Diffuser portion 230 and outlet opening 210 are suitably designed to reduce the occurrence of flow separation from wall surfaces, or formation of turbulent airflow while providing sufficient volume of airflow to cool the cooling fins. In some examples, length 612 of diffuser channel 606 is less than the radius of impeller 206. Specifically, in some examples, length 612 of diffuser channel 606 is 6-11 mm. In some examples, the width (not shown) of diffuser channel 606 is greater than the diameter of impeller 206. In the context of FIG. 6, the width of diffuser channel 606 is perpendicular to the plane of the drawing and parallel to the plane of rotation of impeller 206. The width of diffuser channel 606 refers to the distance between opposite sidewalls of diffuser channel 606. In some examples, the cross-section of diffuser channel 606 along a plane perpendicular to the drawing of FIG. 6 has an aspect ratio of greater than 12, where the aspect ratio is the ratio of the width of the diffuser channel to the height of the diffuser channel.

Diffuser channel 606 diverges such that the height of diffuser channel 606 increases towards outlet opening 210 (e.g., from the edge of impeller 206). For example, height 614 of diffuser channel 606 at the edge of impeller 206 is 3.1-3.8 mm and height 616 of diffuser channel 606 at outlet opening 210 is approximately 4.1-5.1 mm. A diverging diffuser channel can enable outlet opening 210 to be suitably adapted to the height of cooling fins 120 (FIG. 1B) while keeping the vertical profile of the remainder of cooling fan thin so that air can enter the fan inlet with reduced impedance. In the present example, front wall 224 along diffuser channel 606 diverges toward outlet opening 210 with respect to back wall 232. Specifically, in some examples, inner surface 602 of front wall 224 diverges at an angle of 5-10 degrees, 5-7 degrees, or 6-7 degrees with respect to the plane of rotation of impeller 206. In other examples, inner surface 602 of front wall 224 diverges at an angle of 5-10 degrees, 5-7 degrees, or 6-7 degrees with respect to the plane of back wall 232. The plane of rotation of impeller 206 is perpendicular to rotation axis 226. It should be recognized that in other examples, back wall 232 along diffuser channel 606 can (additionally or alternatively) diverge toward outlet opening 210 with respect to front wall 224.

Diffuser portion 230 diverges in a manner that reduces flow separation within diffuser channel 606 and thus reduces turbulent airflow exiting outlet opening 210. Less turbulent airflow can result in less aeroacoustic noise. For example, as shown in FIG. 6, inner surface 602 of diffuser portion 230 is linearly sloped toward the outlet opening and with respect to the plane of rotation of the impeller. In contrast, a curved slope for inner surface 602 can, in some examples, cause undesirable flow separation. Additionally, a gradual divergence angle can be desirable to reduce flow separation. For example, the linear slope of inner surface is 5-10 degrees, 5-7 degrees, or 6-7 degrees. In some examples, the slope of inner surface 602 of diffuser portion 230 is different from the slope of inner surface 218 of portion 216 of front wall 224. Specifically, in the present example, the transition between inner surface 218 of portion 216 and inner surface 602 of diffuser portion 230 is substantially abrupt rather than gradual where a distinct inflection region 608 exists adjacent to outer edge 610 of impeller between inner surface 218 of portion 216 and inner surface 602 of diffuser portion 230. In some examples, the slope of outer surface 604 of front wall 224 at portion 216 and diffuser portion 230 is independent from the slope of inner surfaces 218 and 602 of front wall 224. The slope of outer surface 604 of front wall 224 is aerodynamically optimized for airflow toward inlet opening 212. For example, outer surface 604 of front wall 224 gradually slopes from inlet opening 212 to outlet opening and does not have an inflection region. Additionally, outer surface 604 of front wall 224 has a gradual curved slope rather than a linear slope along diffuser portion 230.

Figure 7:
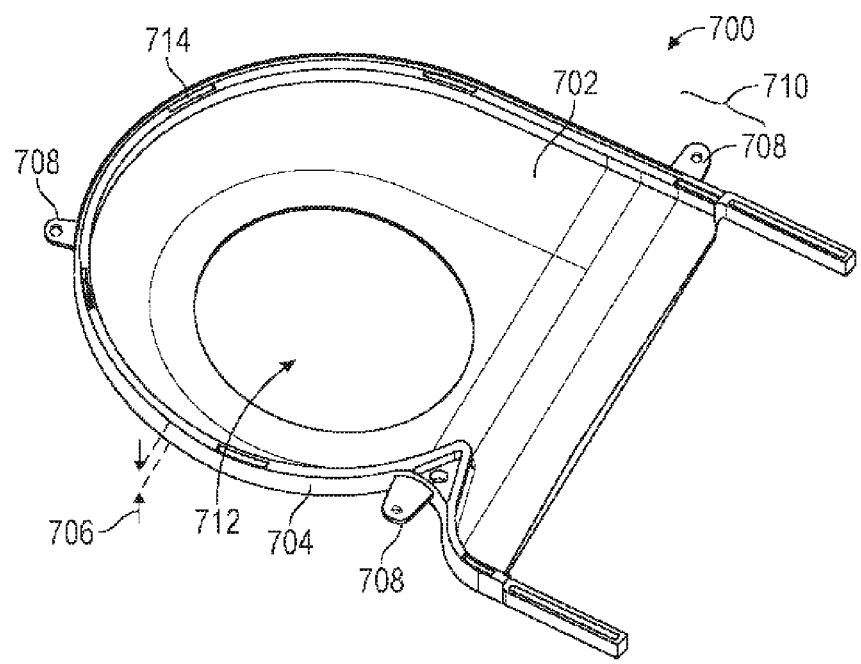
FIG. 7 illustrates a cover portion of a fan enclosure of a cooling fan, according to various examples.
Figure 8:
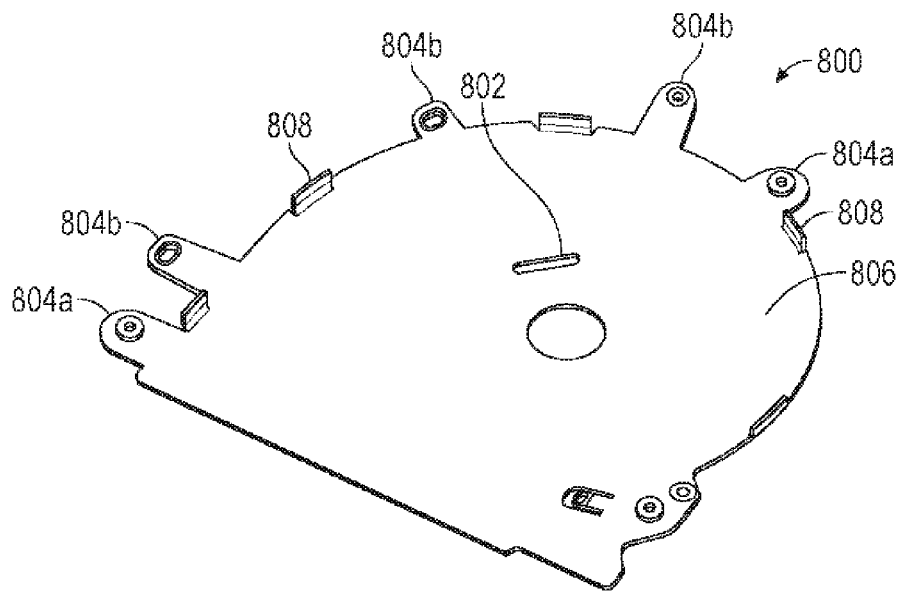
FIG. 8 illustrates a base plate of a fan enclosure of a cooling fan, according to various examples.

Turning now to FIGS. 7 and 8, portions that form fan enclosure 202 of cooling fan 200 are described. FIG. 7 illustrates a perspective view of cover portion 700 of fan enclosure 202, according to various examples. The perspective view of FIG. 7 shows the surface of cover portion 700 that corresponds to the inner surface of fan enclosure 202.

FIG. 8 illustrates base plate 800 of fan enclosure 202, according to various examples. The perspective view of FIG. 8 shows the surface of base plate 800 that corresponds to the inner surface of fan enclosure 202. In the present example, fan enclosure 202 of cooling fan 200 is constructed of only two discrete pieces: cover portion 700 and base plate 800 which are attached to each other using one or more attaching components (e.g., one or more of fasteners, adhesive, etc.) Specifically, cover portion 700 and base plate 800 form front wall 224, sidewalls 234, and back wall 232 of cooling fan 200 that define the fan cavity in which impeller 206 is at least partially housed. Cover portion 700 and base plate 800 are each single-piece members. For example, neither cover portion 700 nor base plate 800 is constructed of two or more parts connected together. It should be recognized that in other examples, the fan enclosure can be constructed with two or more discrete pieces. In those examples, the cover portion or the base plate of the fan enclosure can include two or more parts connected together. In some examples, each of cover portion 700 and base plate 800 is formed from a single material. For example, cover portion 700 is formed from die-cast aluminum or injection molded plastic. Base plate 800 is formed from steel or aluminum.

Base plate 800 includes wall 806 that forms the back wall of the fan enclosure (e.g., back wall 232 of fan enclosure 202). Inner surface of wall 806 is, in some examples, substantially planar. In some examples, outer surface (not shown in FIG. 8) of wall 806 includes a recessed channel for the FPC (e.g., recessed channel 268 for FPC 236 shown in FIG. 2C). In some examples, the recessed channel is recessed by approximately 0.10-0.16 mm. Wall 806 includes opening 802 through which FPC 236 connects to the motor of the cooling fan. In some examples, the thickness of wall 806 is approximately 0.4-0.6 mm. In a specific example, the thickness of wall 806 is approximately 0.5 mm. In some examples, wall 806 has a substantially uniform thickness (excluding the recessed channel). In examples where base plate 800 is formed using two or more parts connected together, base plate 800 can include a spacer layer attached to a main layer. In these examples, the spacer layer can include an opening that defines the recessed channel when attached to the main layer. The spacer layer can comprise a plastic film and the main layer can comprise a metal plate.

Base plate 800 further includes one or more vertical tabs 808 that each extend from an edge along the perimeter of base plate 800. Vertical tabs 808 are adapted to fit into slots 714 of cover portion 700, thereby increasing the stiffness and strength of the adhesive joint between cover 700 and base plate 800. Base plate 800 also includes one or more horizontal tabs 804a-b. In some examples, horizontal tabs 804a are adapted to attach a motherboard (sometimes called a main board, main logic board, or MLB) to base plate 800. For example, as shown in FIG. 8, horizontal tabs 804a include protruding threaded inserts to which a motherboard can be attached using one or more attaching components (e.g., one or more fasteners). In some examples, horizontal tabs 804b are adapted to attach base plate 800 to the base layer (e.g., base layer 126) of the keyboard assembly. In the present example shown in FIG. 8, horizontal tabs 804b do not include protruding threaded inserts.

Cover portion 700 includes front wall 702 and sidewalls 704, which form, for example, front wall 224 and sidewalls 234 of fan enclosure 202. Front wall 702 and sidewalls 704 are integrally formed as a single-piece member and are not two discrete pieces that are connected together. Because front wall 702 and sidewalls 704 are integrated as a single piece and not assembled together from two separate pieces, additional tolerance or margin need not be provided for assembly. This enables cover portion 700 to be constructed with a smaller thickness 706 and enables a reduced clearance 228. Cover portion 700 also occupies a smaller horizontal area since additional attaching components (e.g., fasteners, flanges, rivets, adhesives, etc.) to connect front wall 702 and sidewalls 704 are not needed. Moreover, because front wall 702 and sidewalls 704 are integrally formed as one piece, cover portion 700 is, as a whole, structurally stiffer. This enables cover portion 700 to better support base plate 800 to resist translation of the impeller against the front wall of the fan enclosure during keystroke events on the keyboard. Cover portion 700 also includes tabs 708 that are adapted to attach cover portion 700 to base plate 800 or to base layer 126 of keyboard assembly 118 using one or more attaching components (e.g., one or more fasteners or adhesives).

In some examples, cover portion 700 is die-casted to integrate front wall 702 and sidewalls 704 as a single-piece member. Die-casting can be desirable to form the inner surface of cover portion 700 independent from the outer surface of cover portion 700. For example, the inner surface of cover portion 700 can be optimized for the airflow characteristics within the fan enclosure whereas the outer surface of cover portion 700 can be optimized for aesthetics and for airflow characteristics toward the inlet opening of the fan enclosure. Specifically, as discussed in greater detail below with respect to FIGS. 9A-B, the inner and outer surfaces of diffuser portion 710 of cover portion 700 can be independently shaped. Furthermore, forming cover portion 700 with die-casting can be desirable to integrate the external protrusion (e.g., external protrusion 214) on the outer surface of cover portion 700. Such integration enables greater strength and stiffness of front wall 702 when a load is applied to the external protrusion. Injection molding of cover portion 700 using a plastic material can provide similar benefits, though the stiffness tends to be less than that associated with die-cast materials (e.g., metal).

Figure 9A:
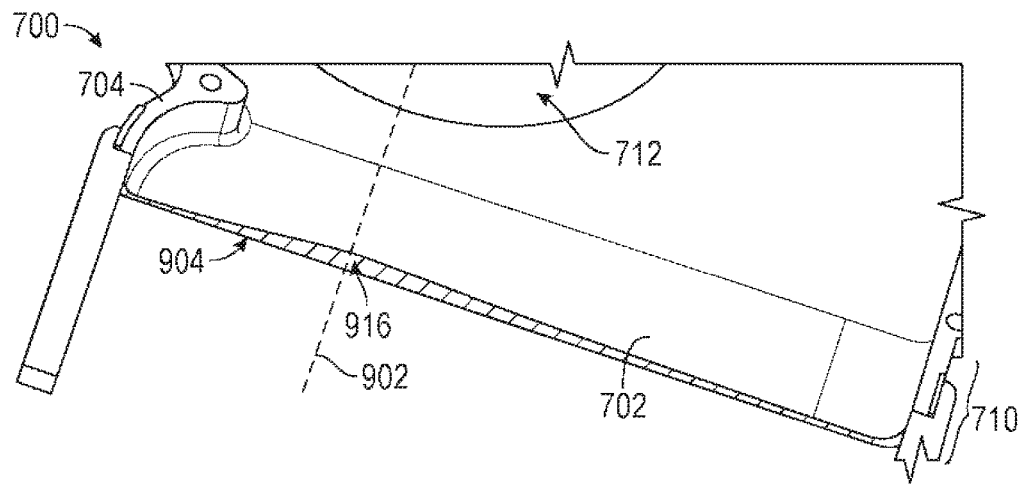
FIGS. 9A-9B illustrate cross-sectional perspective views of a cover portion of a fan enclosure of a cooling fan, according to various examples.
Figure 9B:
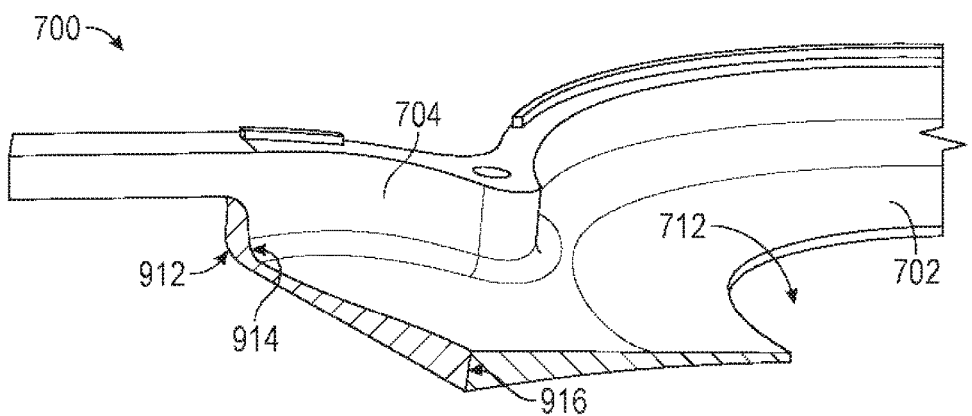

FIGS. 9A-B illustrate cross-sectional perspective views of cover portion 700, according to various examples. In particular, FIG. 9B is a cross-sectional perspective view of cover portion 700 along dotted line 902 indicated on FIG. 9A. As shown in FIGS. 9A-B, the thickness of sidewall 704 is greater than the thickness of front wall 702. A thicker sidewall 704 can be desirable for providing greater structural support and stiffness whereas a thinner front wall 702 can be desirable to reduce the overall thickness of cooling fan, thereby enabling a thinner electronic device. The thickness gradually reduces and tapers from sidewall 704 to front wall 702. The gradual taper can be desirable for improved mold flow and manufacturing process yield during die-casting. Additionally, the gradual taper can provide improved aerodynamic airflow and thus less aeroacoustic noise. In particular, the inner and outer surfaces of cover portion 700 transition smoothly from sidewalls 704 to front wall 702 and do not include any gap or interface that would be characteristic of front wall 702 and sidewalls 704 being two separate pieces that are joined together. For example, with reference to FIG. 9B, internal and external corners 914 and 912 between front wall 702 and sidewalls 704 are smooth and gradually rounded (e.g., with radius of 1-3 mm).

As shown in FIG. 9A, the thickness of front wall 702 varies from one sidewall to the opposite sidewall of cover portion 700 at diffuser portion 710. As a result, the height of the diffuser channel (e.g., diffuser channel 606 of FIG. 6) in the diffuser portion of the fan enclosure (e.g., diffuser portion 230 of FIGS. 2A-2B) varies across the outlet opening. For example, as shown in FIG. 2B, height 242 of outlet opening 210 varies across width 244 of outlet opening 210, where height 242 is perpendicular to width 244. Width 244 is parallel to the plane of rotation of impeller 206. Varying the thickness of front wall 702 of cover portion 700 and thus the height of the diffuser channel across the width of the diffuser channel can be desirable to optimize the aerodynamics of the diffuser channel. This in turn can reduce the generation of aeroacoustic noise. In particular, airflow proximate to the center portion of the diffuser channel between the opposite sidewalls of fan enclosure 202 may have a strong cross-flow component due to the tangential velocity induced by the rotation of impeller 206. The cross-flow component can lead to flow separation along the inner surface of diffuser portion 230. Increasing the thickness of front wall 702 of cover portion 700 and thus reducing height 242 of outlet opening 210 proximate to the center of the diffuser channel can reduce flow separation by accelerating the flow in that region and thus reduce the formation of turbulence.

Additionally, varying the thickness of front wall 702 of cover portion 700 and thus the height of the diffuser channel can enable airflow to exit outlet opening 210 with a more uniform velocity across width 244 of outlet opening 210. Specifically, as shown in FIG. 2B, height 242 of outlet opening 210 can be greatest where airflow rate is the greatest and smallest where airflow rate is the lowest at outlet opening 210. In the present example, height 242 of outlet opening 210 is the greatest adjacent to sidewalls 234 and smallest at position 246 of outlet opening 210 that is between sidewalls 234. Height 242 gradually reduces from sidewalls 234 toward position 246 of outlet opening 210. In some examples, height 242 of outlet opening adjacent to sidewalls is approximately 3.5-4.2 mm and height 242 of outlet opening at position 246 is approximately 2.5-3.5 mm. Position 246 is disposed between sidewalls 260 and 262 of outlet opening 210. In particular, position 246 is disposed closer to sidewall 260 than to sidewall 262. Sidewall 260 is closer to impeller 206 than sidewall 262. In some examples, the ratio of the distance between position 246 and sidewall 260 to the distance between position 246 and sidewall 262 is 0.20-0.40. Alternatively, in other examples (not shown), height 242 of outlet opening 210 is approximately uniform across width 244, where height 242 of outlet opening 210 is not reduced at position 246.

Returning to FIG. 9A, thickest portion 916 of front wall 702 in diffuser portion 710 is where dotted line 902 intersects with edge 904 of cover portion 700. As shown, the thickness of front wall 702 in diffuser portion 710 tapers from thickest portion 916 toward each sidewall of opposite sidewalls 704. Additionally, as shown in FIG. 9B, the thickness of front wall 702 in diffuser portion 710 increases from inlet opening 712 to thickest portion 916. In some examples, the inner surface of front wall 702 in diffuser portion 710 has a topography that is independent of the topography on the outer surface of front wall 702 in diffuser portion 710. In particular, as shown in FIGS. 9A-B, the inner surface of front wall 702 in diffuser portion 710 slopes away from thickest portion 916 toward sidewalls 704 and inlet opening 712. In contrast, the topography on the outer surface of front wall 702 in diffuser portion 710 is more uniform and is not dependent on the position of thickest portion 916.

Figure 10:
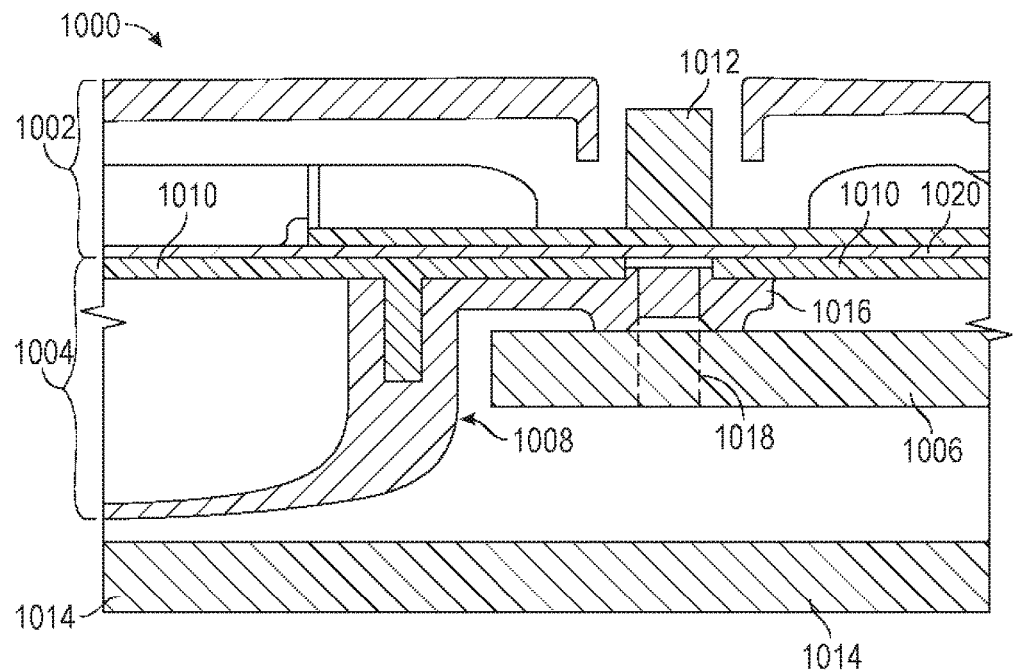
FIG. 10 illustrates a cross-sectional view of an electronic device where the motherboard is attached to a cover portion of a fan enclosure of a cooling fan, according to various examples.
Figure 11:
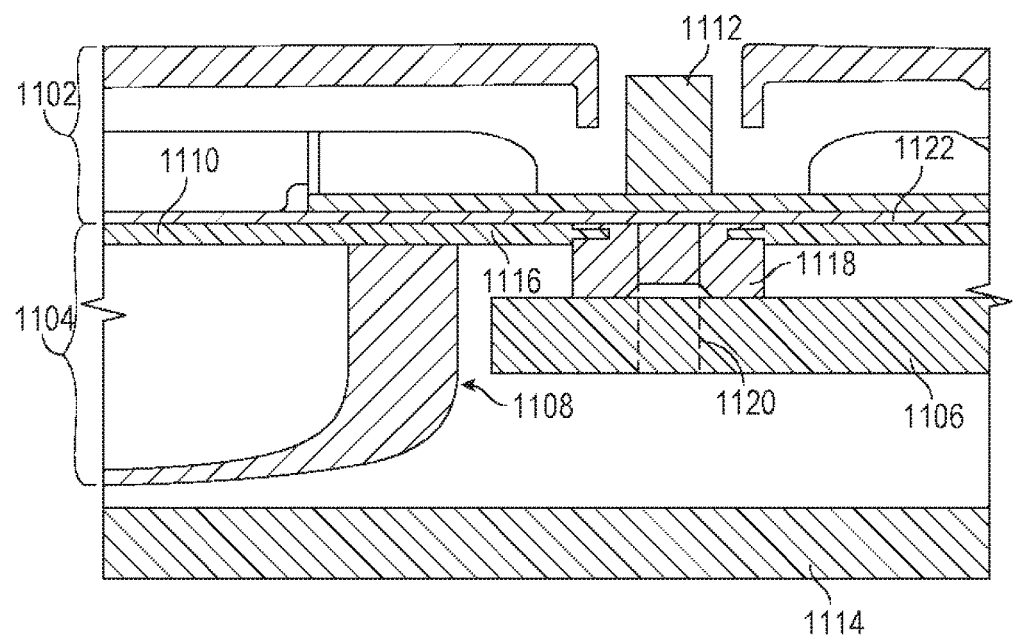
FIG. 11 illustrates a cross-sectional view of an electronic device where the motherboard is attached to a base plate of a fan enclosure of a cooling fan, according to various examples.

Turning now to FIGS. 10 and 11, two different mounting configurations with respect to a cooling fan in an electronic device are described. FIG. 10 illustrates a cross-sectional view of electronic device 1000 where motherboard 1006 is attached to cover portion 1008 of the fan enclosure of cooling fan 1004, according to various examples. FIG. 11 illustrates a cross-sectional view of electronic device 1100 where motherboard 1106 is attached to base plate 1110 of the fan enclosure of cooling fan 1104, according to various examples. In both mounting configurations, the cooling fan is disposed between the keyboard assembly and the motherboard where the motherboard is mounted to the cooling fan and the cooling fan is mounted to the keyboard assembly. The cooling fan is thus a mounting point for the motherboard and functions as an integral structural component for the motherboard. This can be advantageous for more efficiently integrating the internal components of the electronic device into a smaller space, thereby enabling a thinner and sleeker electronic device. The motherboard includes at least a printed circuit board and a plurality of electrical components that include at least a central processing unit (CPU) and memory.

As shown in FIG. 10, the fan enclosure of cooling fan 1004 is constructed of two separate pieces: cover portion 1008 and base plate 1010, which can be similar or identical to cover portion 700 and base plate 800, respectively. In this example, motherboard 1006 is attached to cover portion 1008 of cooling fan 1004. Specifically, cover portion 1008 includes one or more tabs 1016 that extend from the main body of cover portion 1008. One or more tabs 1016 can be similar or identical to tabs 708 of cover portion 700 (FIG. 7). Motherboard 1006 is directly attached to one or more tabs 1016 of cover portion 1008 without directly contacting any portion of base plate 1010. In some examples, one or more attaching components 1018 (e.g., one or more fasteners or adhesives) directly attach: motherboard 1006 to cooling fan 1004, cooling fan 1004 to keyboard assembly 1002 (via base layer 1020), and keyboard assembly 1002 to top case 1012. Motherboard 1006 and cooling fan 1004 are disposed between top case 1012 and bottom case 1014.

In other examples (not shown), base plate 1010 is directly attached to keyboard assembly 1002 and top case 1012 using one or more attaching components via one or more tabs of base plate 1010 (e.g., tabs 804b of FIG. 8). Additionally, motherboard 1006 is directly attached to cover portion 1008 using one or more attaching components via one or more tabs of cover portion 1008 (e.g., tabs 708 of FIG. 7). In some examples, motherboard 1006 is directly attached to one or more tabs of cover portion 1008 without being directly attached to base plate 1010.

With reference to FIG. 11, electronic device 1100 is similar to electronic device 1000 except that cover portion 1108 and base plate 1110 have a different mounting configuration with respect to motherboard 1106. In this example, motherboard 1106 is attached to base plate 1110 of the fan enclosure of electronic device 1100 without being directly attached to cover portion 1108. Specifically, base plate 1110 includes one or more tabs 1116 that extend from the main body of base plate 1110. One or more tabs 1116 can be similar or identical to tabs 804a of base plate 800. In the present example, one or more tabs 1116 include threaded inserts 1118. Motherboard 1106 is attached to one or more tabs 1116 of base plate 1110 via threaded inserts 1118 without directly contacting cover portion 1108. In other examples, the threaded inserts can be optional. In some examples, one or more attaching components 1120 (e.g., one or more fasteners or adhesives) directly attach: motherboard 1106 to cooling fan 1104, cooling fan 1104 to keyboard assembly 1102 (via base layer 1122), and keyboard assembly 1102 to top case 1112. In examples, attaching components 1120 are positioned through tabs 1116 of base plate 1110 without being positioned through cover portion 1108. Motherboard 1106 and cooling fan 1104 are disposed between top case 1112 and bottom case 1114.

Figure 12A:
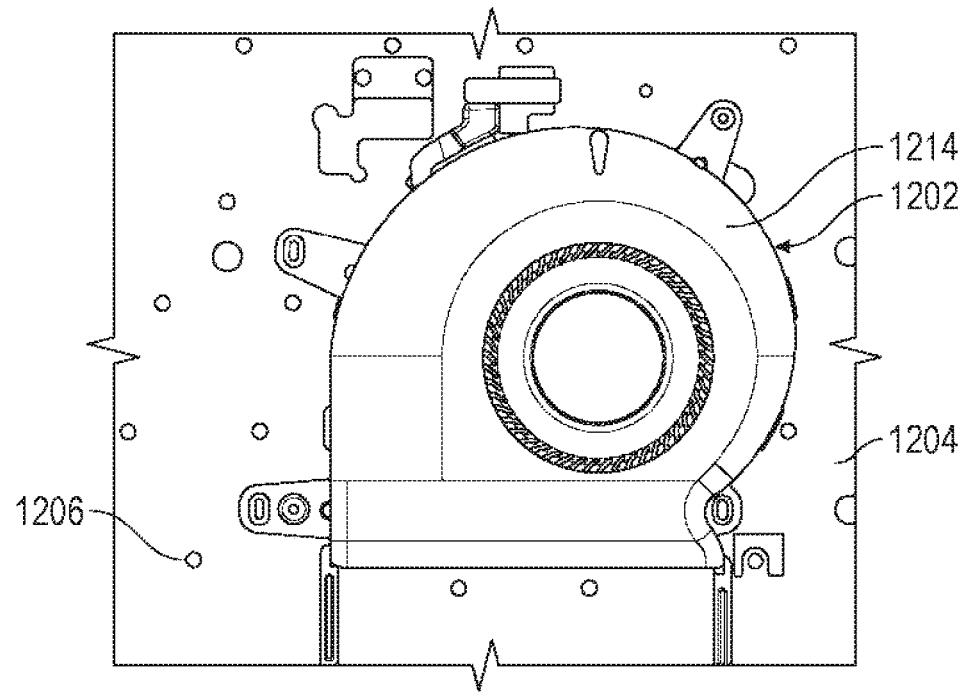
FIG. 12A illustrates a top-down view of a cooling fan attached to a base layer of a keyboard assembly, according to various examples.
Figure 12B:
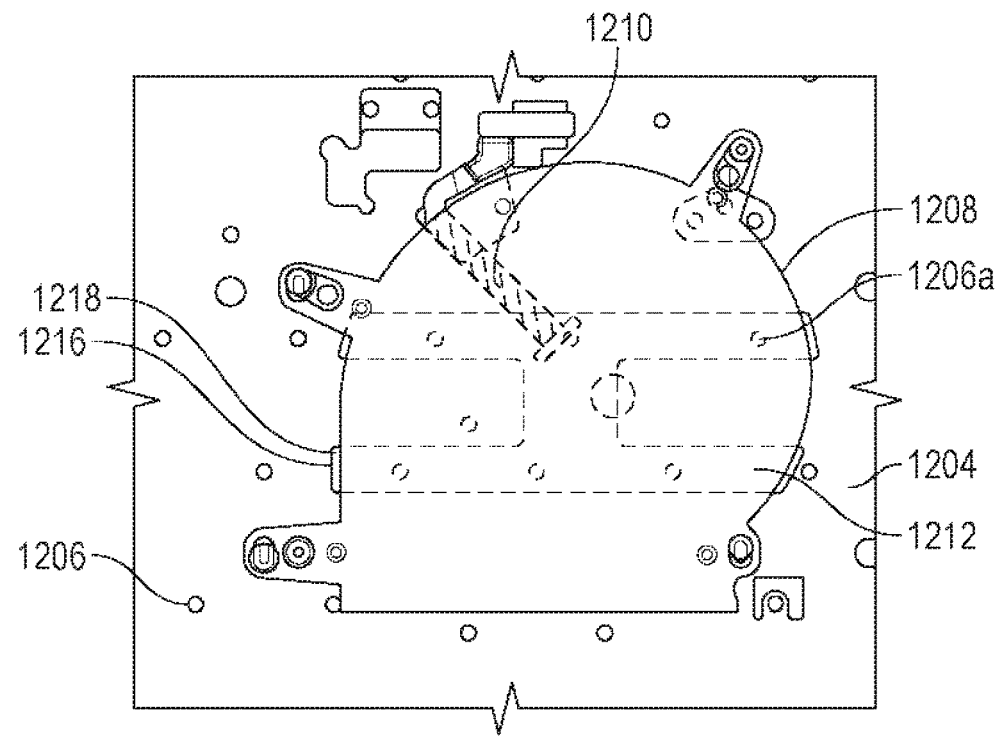
FIG. 12B illustrates a top-down view of a base plate of a fan enclosure of a cooling fan attached to a base layer of a keyboard assembly, according to various examples.

Turning now to FIGS. 12A-B, additional aspects of attaching a cooling fan against a bottom surface of a keyboard assembly are described. FIG. 12A illustrates a top-down view of cooling fan 1202 attached to base layer 1204 of a keyboard assembly, according to various examples. Cooling fan 1202 and base layer 1204 are similar or identical to cooling fan 200 and base layer 126 of FIG. 1C, respectively. In the top-down view of FIG. 12A, the bottom surface of base layer 1204 is shown. The keys (not shown) of the keyboard assembly are facing into the plane of the drawing. Base layer 1204 includes plurality of openings 1206 that extend from the top surface to the bottom surface of base layer 1204. Plurality of openings 1206 can serve to allow air to vent through base layer 1204 into the interior of the electronic device during, for example, a keystroke event. In the present example, cooling fan 1202 has a fan enclosure that includes cover portion 1214 and base plate 1208.

FIG. 12B illustrates a similar configuration as FIG. 12A, except that most of the components of cooling fan 1202 (including cover portion 1214 and the impeller) have been removed to more clearly show the features between base layer 1204 of the keyboard assembly and base plate 1208 of cooling fan 1202. As shown, only base plate 1208 and FPC 1210 of cooling fan 1202 remain. The top-down view of base plate 1208 in FIG. 12B shows the inner surface of base plate 1208 and the bottom surface of base layer 1204. The outer surface (not shown) of base plate 1208 is oriented toward the bottom surface of base layer 1204. Cooling fan 1202 is attached to the keyboard assembly such that a majority of the outer surface of base plate 1208 is positioned substantially flush against the bottom surface of base layer 1204. FPC 1210 is disposed between base plate 1208 and base layer 1204 such that FPC 1210 directly contacts the outer surface of base plate 1208 and the bottom surface of base layer 1204. Because base plate 1208 is positioned directly against base layer 1204, base plate 1208 and base layer 1204 provide EMI shielding to FPC 1210. For example, each base plate 1208 and base layer 1204 comprises a metal layer that inherently shields FPC 1210 from EMI generated by the electronic components within the electronic device. As a result of this configuration, FPC 1210 need not include a separate EMI shielding layer. Specifically, in the present example, FPC 1210 does not include an EMI shielding layer, such as a metal layer. This is advantageous for enabling a thinner FPC, which results in a thinner overall system. A thinner FPC also enables the recessed channel (e.g., recessed channel 268) of base plate 1208 to be shallower, which can reduce the extent that the recessed channel detracts from the stiffness of base plate 1208. A stiffer base plate 1208 is desirable for resisting against deflection under user loading and associated rubbing between the impeller and the cover portion.

As shown in FIG. 12B, base layer 1204 includes recessed portion 1212. In some examples, recessed portion 1212 has a recessed depth of 0.1-0.2 mm with respect to bottom surface of base layer 1204. Two or more openings 1206a of plurality of openings 1206 coincide with recessed portion 1212. Recessed portion 1212 and the outer surface of base plate 1208 form a venting channel. One or more edges 1216 of recessed portion 1212 extend beyond a perimeter of base plate 1208. The one or more edges 1216 thus form openings 1218 with base plate 1208 to allow air to exit from venting channel. The venting channel couples two or more openings 1206a such that during keystroke events, air can vent through each of two or more openings 1206a into the venting channel and out through the one or more openings 1218 at edges 1216 of recessed portion 1212. Venting channel can be desirable to provide a desirable tactile response to the user when the user depresses a key positioned directly above cooling fan 1202. Additionally, it enables the keys positioned directly above cooling fan 1202 to have a similar tactile response as other keys on the keyboard assembly, which improves the user experience.

Further, recessed portion 1212 can be advantageous for reducing movement of base plate 1208 during a keystroke event. This reduces the likelihood that base plate 1208 would cause the impeller to directly contact the cover portion of the fan assembly. In particular, recessed portion 1212 is positioned to correspond to one or more components of the keyboard assembly that coincide with a load path during a keystroke event. When a key directly above cooling fan 1202 is depressed, a load is transmitted from the key through the one or more components to a portion of base layer 1204 that corresponds to recessed portion 1212. The load causes base layer 1204 to locally depress toward base plate 1208 of cooling fan 1202. However, due to the presence of recessed portion 1212, base layer 1204 locally deforms into the venting channel, which reduces the likelihood that base plate 1208 is translated by the key depression event. This in turn reduces the likelihood that the impeller is forced into the cover portion.

In some examples, at least part of recessed portion 1212 coincides with the path along which FPC 1210 is routed between base plate 1208 and base layer 1204. In these examples, FPC 1210 is routed through the channel formed by recessed portion 1212 and base plate 1208. The depth of the recessed channel (e.g., recessed channel 268) of base plate 1208 can thus be reduced or, alternatively, the recessed channel of base plate 1208 can be completely eliminated. Eliminating the recessed channel (or reducing its depth) of base plate 1208 can be desirable for improving the overall stiffness of base plate 1208, which enables base plate 1208 to better resist against deflection under user loading and associated rubbing between the impeller and the cover portion.

Figure 13:
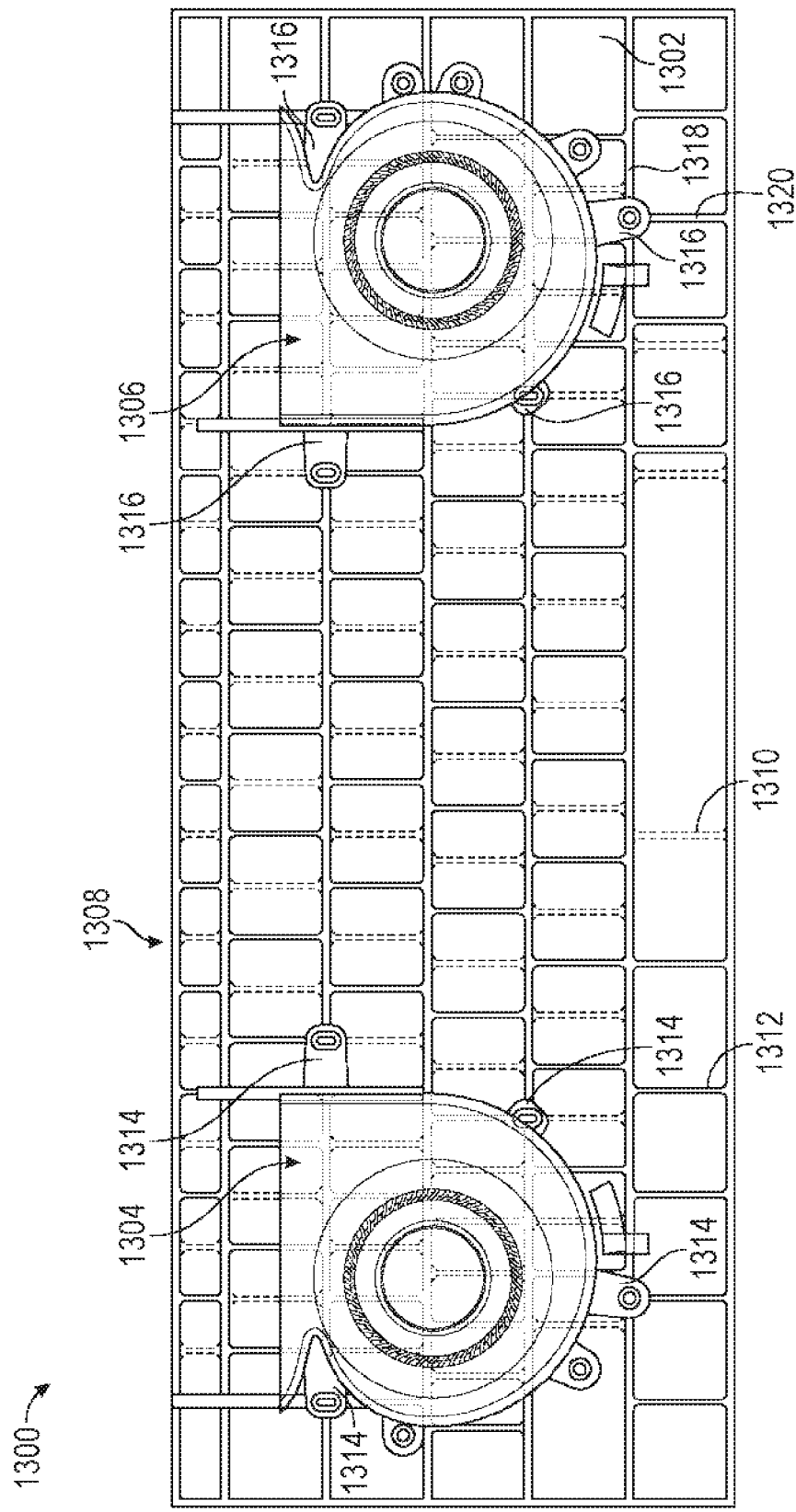
FIG. 13 illustrates a top-down view of a portion of an electronic device where cooling fans are attached to a keyboard assembly that has one of several possible configurations, according to various examples.

With reference back to FIGS. 7 and 8, tabs 708 of cover portion 700 or tabs 804b of base plate 800 are, in some examples, configured to enable the cooling fan to be attached to approximately the same location of the keyboard regardless of the mechanical layout (e.g., ANSI, ISO, or JIS) of the keys of the keyboard and without having to customize tabs 708 or 804b for each mechanical layout. For example, FIG. 13 illustrates a top-down view of a portion of electronic device 1300 where cooling fans 1304, 1306 are attached to keyboard assembly 1308 that has one of three possible configurations. Cooling fans 1304, 1306 are similar or identical to cooling fan 200, described above. In this example, keys 1302 of keyboard assembly 1308 are facing into the plane of the drawing and cooling fans 1304, 1306 are disposed over keyboard assembly 1308 such that the inlet opening of each cooling fan is facing away from keyboard assembly 1308. In FIG. 13, three possible mechanical layouts (e.g., ANSI, ISO, or JIS) of the keys 1302 of keyboard assembly 1308 are shown overlapping together. Specifically, solid lines 1312 depict the configuration of the keyboard web of the top case (e.g., top case 112) of electronic device 1300 surrounding the keys 1302 of keyboard assembly for the ANSI keyboard layout. Dotted lines 1310 depict differences in the configuration of the keyboard web of the top case for ISO and JIS keyboard layouts relative to the ANSI keyboard layout. In this example, the overall area occupied by each keyboard layout (ANSI, ISO, or JIS) is approximately the same.

As shown in FIG. 13, the base plate of each cooling fan 1304, 1306 includes four tabs (e.g., tabs 1314 of cooling fan 1304 and tabs 1316 of cooling fan 1306). Tabs 1314, 1316 are similar or identical to tabs 804b, described above with reference to FIG. 8. Each of tabs 1314, 1316 includes an opening for receiving a fastener (e.g., fastener 1416 shown in FIG. 14A). In some examples, the openings of one or more of tabs 1314, 1316 have an elliptical shape to provide flexibility for the mounting position to the keyboard web. Each tab of tabs 1314, 1316 is configured such that the center of each opening coincides with a respective mounting point on the keyboard web of the top case. Specifically, the mounting points are positioned where a horizontal portion (e.g., 1318) and a vertical portion (e.g., 1320) of the keyboard web intersect between keys 1302 of keyboard assembly 1308. Notably, the same mounting points are chosen such that they are present on the keyboard web regardless of the keyboard layout (e.g., ANSI, ISO, or JIS) that is implemented. As a result, cooling fans 1304, 1306 can be attached at approximately the same location with respect to keyboard assembly 1308 for multiple keyboard layouts (e.g., ANSI, ISO, or JIS) using the same fan configuration. This is technically desirable as it beneficially reduces manufacturing variations for the cooling fan and the electronic device.

In a specific example of cooling fan 1304, the openings of tabs 1314 are aligned with fourth specific mounting points on the keyboard web that are position between specific keys 1302 of keyboard assembly 1308, which has an ANSI (American English) layout. In this example, a first mounting point is disposed at an intersection in the keyboard web between three keys 1302 corresponding to the number "1," the symbol "~," and the "tab" function, respectively. A second mounting point is disposed at an intersection in the keyboard web between three keys 1302 corresponding to the letters "E" and "R" and the number "4", respectively. A third mounting point is disposed at an intersection in the keyboard web between three keys 1302 corresponding to the letters "D," "S," and "X," respectively. Finally, a fourth mounting point is disposed at an intersection in the keyboard web between three keys 1302 corresponding to the "shift," "control," and "option" functions, respectively.

In a specific example of cooling fan 1306, the openings of tabs 1316 are aligned with fourth specific mounting points on the keyboard web that are position between specific keys 1302 of keyboard assembly 1308, which has an ANSI (American English) layout. In this example, a first mounting point is disposed at an intersection in the keyboard web between three keys 1302 corresponding to the numbers "9" and "0" and the letter "O," respectively. A second mounting point is disposed at an intersection in the keyboard web between three keys 1302 corresponding to the symbols "]" and "\" and the "delete" function, respectively. A third mounting point is disposed at an intersection in the keyboard web between three keys 1302 corresponding to the letter "L" and the punctuation marks "." and ";", respectively. Finally, a fourth mounting point is disposed at an intersection in the keyboard web between three keys 1302 corresponding to the "shift," "left arrow," and "up/down arrow" functions, respectively.

Although the cooling fans 1304, 1306 shown in FIG. 13 each have four tabs 1314, 1316 for attaching cooling fans 1304, 1306 to keyboard assembly 1308, it should be recognized that in other examples, the number of tabs 1314, 1316 can vary. Furthermore, although in the present example, cooling fans 1304, 1306 are attached to keyboard assembly 1308 via tabs 1314, 1316 extending from the base plate of the cooling fans, it should be appreciated that in other examples, the configuration describe above with respect to FIG. 13 can similarly be implemented using tabs (e.g., tabs 708 in FIG. 7) extending from the cover portion of the cooling fans. For example, tabs 1314, 1316 can extend from the cover portion rather than from the base plate of the cooling fans.

Figure 14A:
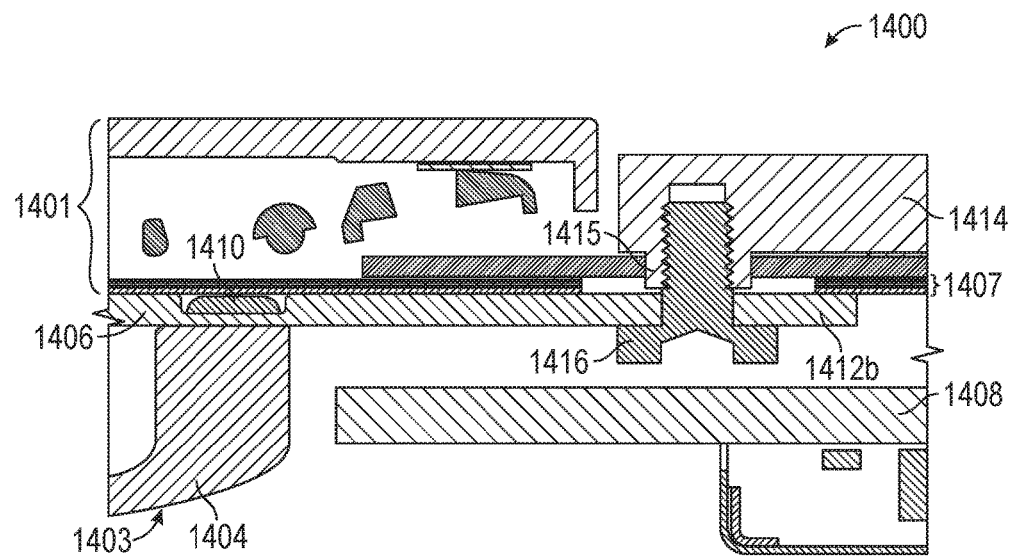
FIG. 14A illustrates a cross-sectional view of a portion of an electronic device where a cooling fan is attached to a keyboard assembly via a base plate of the cooling fan, according to various examples.
Figure 14B:
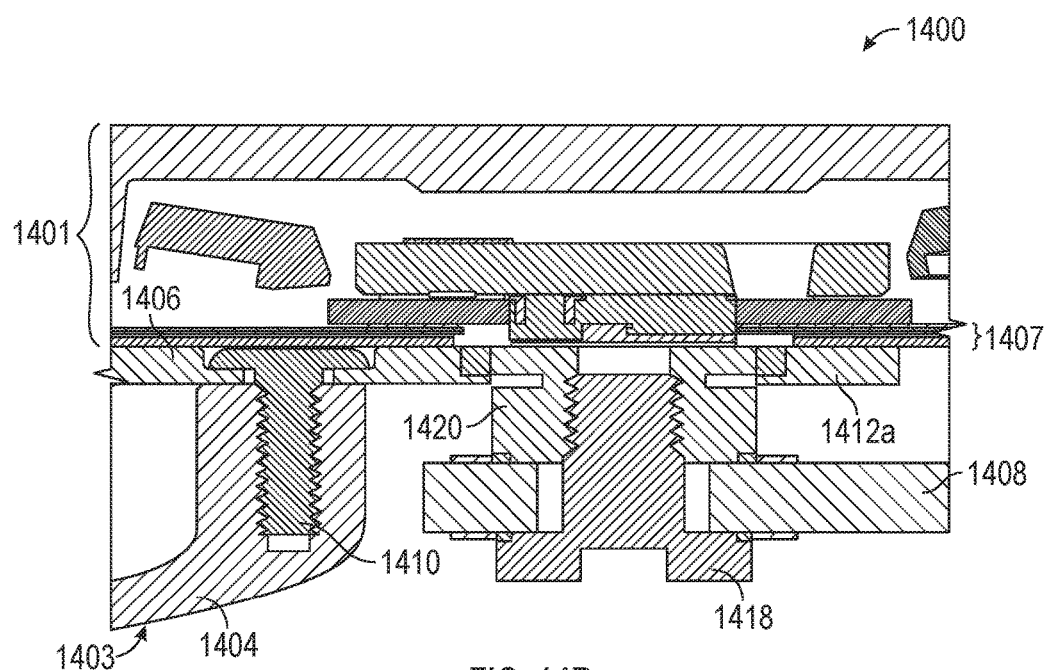
FIG. 14B illustrates a cross-sectional view of a portion of an electronic device where a motherboard is attached a base plate of a cooling fan, according to various examples.

Turning now to FIGS. 14A-B, cross-sectional views of a portion of electronic device 1400 are shown, according to various examples. Specifically, FIG. 14A illustrates an exemplary mounting configuration of cooling fan 1403 in electronic device 1400, and FIG. 14B illustrates an exemplary mounting configuration of motherboard 1408 to cooling fan 1403. As shown in FIG. 14A, cooling fan 1403 includes base plate 1406 that is attached to cover portion 1404 by fastener 1410. Base plate 1406 includes one or more tabs 1412b that are similar or identical to tabs 804b of FIG. 8. Fastener 1416 attaches cooling fan 1403 through an opening of tab 1412b and threads into a portion of keyboard web 1414 of the top case. The portion of keyboard web 1414 that receives fastener 1416 corresponds to one of the mounting points on the keyboard web discussed above in FIG. 13. As shown in FIG. 14A, the portion of keyboard web 1414 includes mini boss 1415 that extends toward tab 1412b. Mini boss 1415 serves to increase the threading and thus strengthen the threaded joint. Mini boss 1415 is in clearance to tab 1412b of base plate 1406 such that cooling fan 1403 is fixed against base layer 1407 of keyboard assembly 1401, thereby clamping keyboard assembly 1401 against keyboard web 1414 of the top case. In some examples, tab 1412b is laser etched around the opening of tab 1412b such that fastener 1416 creates a conductive path between cooling fan 1403 and the top case of electronic device 1400.

In some examples, motherboard 1408 is structurally tied to the top case of electronic device 1400 through one or more tabs 1412a of base plate 1406. This is a desirable design feature that enables flexibility for mounting motherboard 1408 in electronic device 1400 and allows more efficient layout of motherboard 1408 within electronic device 1400. In contrast, if motherboard 1406 were to be mounted to keyboard web 1414 of the top case rather than to tabs 1412a of base plate 1406, the mounting points of motherboard 1408 would need to align with common intersections on keyboard web 1414 for various keyboard layouts, thereby restricting the mounting options for motherboard 1408. As shown in FIG. 14B, motherboard 1408 is attached to tab 1412a of base plate 1406 using fastener 1418. Specifically, fastener 1418 passes through an opening in motherboard 1408 and ties into threaded insert 1420 that is attached to tab 1412b of base plate 1406. In some examples, a circular piece of conductive foam is disposed between tab 1412a and base layer 1407 of keyboard assembly 1401. The conductive foam creates an additional conductive path between cooling fan 1403 and base layer 1407 of keyboard assembly 1401.

The foregoing description should be understood to include embodiments of cooling fans and electronic devices with cooling fans that include any combination of the features described herein. For example, one embodiment of a cooling fan includes a single-piece cover portion (e.g., cover portion 700) having independently optimized aerodynamic internal and external surfaces. The cover portion includes sidewalls (e.g., sidewall 704) that gradually taper to the front wall (e.g., front wall 702). The cover portion also includes a sloped portion surrounding the inlet opening (e.g., inner surface 218 of portion 216) to provide additional margin to the blades of the impeller. An external protrusion (e.g., external protrusion 214) extends from an external surface of the cover portion. Further, the cover portion includes a diffuser portion (e.g., diffuser portion 710) with an internal surface topography designed to reduce localized flow separation. The slope of the inner surface of the diffuser portion is independent of the slope of the outer surface of the diffuser portion.

Another embodiment of an electronic device includes a cooling fan that is directly mounted to a keyboard assembly such that a majority of the outer surface of the base plate (e.g., base plate 1208) is flush against the base layer (e.g., base layer 1204) of the keyboard assembly. The FPC (e.g., FPC 236) of the cooling fan is disposed within a recessed channel (e.g., recessed channel 268) on the base plate of the cooling fan. The FPC is further positioned between the base layer of the keyboard assembly and the base plate of the cooling fan. The FPC is shielded from EMI by being positioned between the base plate and the base layer and does not have a separate EMI shielding layer. The cooling fan is attached to the keyboard assembly via tabs (e.g., tabs 708) that extend from the cover portion of the cooling fan. Alternatively, the cooling fan is attached to keyboard assembly via tabs (e.g., tabs 804) that extend from the base plate of the cooling fan. The tabs of the cover portion or the base portion include threaded inserts. The base layer of the keyboard assembly includes a recessed portion (e.g., recessed portion 1212) that forms a venting channel with the base plate of the cooling fan.

The terminology used in the description of the various described examples herein is for the purpose of describing particular examples only and is not intended to be limiting. As used in the description of the various described examples and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

What is claimed is:

1. An electronic device having an internal cooling fan, the electronic device comprising:
   a fan assembly attached to a keyboard assembly, the fan assembly comprising:
      a fan enclosure having, on a surface, an inlet opening and an external protrusion; and
      an impeller at least partially inside the fan enclosure; and
   a bottom case, the fan assembly positioned between the keyboard assembly and the bottom case and oriented such that the inlet opening and the external protrusion face the bottom case,
   wherein the external protrusion maintains a passage between the fan enclosure and the bottom case that allows air to enter the inlet opening, wherein the entire external protrusion is positioned on a side of the inlet opening that is opposite of a diffuser portion of the fan enclosure, and wherein at least a portion of the passage extends continuously from an inner surface of the bottom case to a surface of the external protrusion closest to the inner surface of the bottom case.

2. The device of claim 1, wherein a cross-section of the external protrusion has a teardrop shape.

3. The device of claim 2, wherein the cross-section of the external protrusion tapers toward the inlet opening.

4. The device of claim 1, wherein the external protrusion is separated from the bottom case by a gap.

5. The device of claim 1, wherein the external protrusion is positioned closer to a sidewall of the fan enclosure than the inlet opening, and wherein at least a portion of the sidewall of the fan enclosure is parallel to a rotation axis of the impeller.

6. The device of claim 1, wherein a portion of the impeller extends out from within the fan enclosure through the inlet opening.

7. The device of claim 1, wherein at least a portion of a wall on which the surface is disposed increases in thickness radially outward from the inlet opening.

8. The device of claim 1, wherein the inlet opening is disposed on a wall of the fan enclosure, wherein the impeller comprises a plurality of blades, each blade of the plurality of blades includes an edge proximate to a portion of the wall surrounding the inlet opening, and wherein the edge of each blade of the plurality of blades is sloped away from a rotation axis of the impeller.

9. The device of claim 8, wherein an inner surface of the portion of the wall surrounding the inlet opening is parallel to the edge of each blade of the plurality of blades.

10. The device of claim 9, wherein the edge of each blade of the plurality of blades is positioned no more than 0.6 mm from the inner surface of the portion of the wall surrounding the inlet opening.

11. The device of claim 1, wherein the diffuser portion comprises:
    a diffuser channel; and
    an outlet opening through which air exits the fan assembly, the outlet opening disposed at an end of the diffuser channel,
    wherein the diffuser channel diverges toward the outlet opening with respect to a plane of rotation of the impeller.

12. The device of claim 11, wherein at least a wall of the diffuser channel diverges toward the outlet opening at an angle of 5-7 degrees with respect to the plane of rotation of the impeller.

13. The device of claim 11, wherein:
    an inner surface of the diffuser portion is linearly sloped toward the outlet opening and with respect to the plane of rotation of the impeller.

14. The device of claim 11, wherein:
    a height of a cross-section of the outlet opening is perpendicular to a width of the cross-section of the outlet opening; and
    the height of the cross-section of the outlet opening varies across the width of the cross-section of the outlet opening.

15. The device of claim 11, wherein:
    a thickest portion of a wall of the diffuser portion is disposed between opposite sidewalls of the diffuser portion; and
    a thickness of the wall of the diffuser portion tapers from the thickest portion toward each sidewall of the opposite sidewalls.

16. The device of claim 15, wherein an inner surface of the wall of the diffuser portion has a topography that is independent of a topography of an outer surface of the wall of the diffuser portion.

17. The device of claim 1, wherein the fan enclosure comprises at least two discrete pieces.

18. The device of claim 1, wherein the fan enclosure consists of a first piece and a second piece that are attached to each other using one or more attaching components.

19. The device of claim 1, further comprising a motherboard, wherein the fan assembly is disposed between the keyboard assembly and the motherboard.

20. The device of claim 19, wherein:
    the fan enclosure comprises a first piece and a second piece that are disposed on opposite sides of the impeller;
    the first piece of the fan enclosure has the inlet opening; and
    the motherboard is directly attached to the first piece of the fan enclosure.

21. The device of claim 19, wherein:
    the fan enclosure comprises a first piece and a second piece that are disposed on opposite sides of the impeller;
    the first piece of the fan enclosure has the inlet opening; and
    the motherboard is directly attached to the second piece of the fan enclosure without being directly attached to the first piece of the fan enclosure.

22. The device of claim 1, wherein the fan enclosure includes a second wall disposed on a side of the fan enclosure opposite of the inlet opening, and wherein the second wall of the fan enclosure is directly attached to a bottom surface of the keyboard assembly.

23. The device of claim 22, wherein
    a majority of an outer surface of the second wall of the fan enclosure is positioned flush against the bottom surface of the keyboard assembly.

24. The device of claim 23, wherein:
    the fan assembly includes a flexible printed circuit configured to transmit a back electromotive force signal generated by a motor of the fan assembly;
    the flexible printed circuit is disposed between the outer surface of the second wall of the fan enclosure and the bottom surface of the keyboard assembly; and
    the flexible printed circuit does not include an electromagnetic interference (EMI) shielding layer.

25. The device of claim 1, wherein:
- a base layer of the keyboard assembly includes a plurality of openings configured to allow air to pass through the base layer; and
- a recessed portion of the base layer and an outer surface of the fan enclosure form a venting channel, the venting channel coupling two or more openings of the plurality of openings.

26. The device of claim 25, wherein an edge of the recessed portion of the base layer extends beyond a perimeter of the fan assembly.

27. The device of claim 2, wherein a first end of the cross-section of the external protrusion is positioned closer to the inlet opening than a second end of the cross-section of the external protrusion, and wherein a diameter at the second end is greater than a diameter at the first end.

28. The device of claim 1, wherein the external protrusion is entirely disposed between the inlet opening and an external sidewall of the fan enclosure opposite of the diffuser portion.

* * * * *